(12) United States Patent
Iwakaji et al.

(10) Patent No.: US 11,349,018 B2
(45) Date of Patent: May 31, 2022

(54) SEMICONDUCTOR DEVICE AND SEMICONDUCTOR CIRCUIT

(71) Applicants: Kabushiki Kaisha Toshiba, Minato-ku (JP); Toshiba Electronic Devices & Storage Corporation, Minato-ku (JP)

(72) Inventors: Yoko Iwakaji, Meguro (JP); Tomoko Matsudai, Shibuya (JP); Takeshi Suwa, Kawasaki (JP)

(73) Assignees: Kabushiki Kaisha Toshiba, Minato-ku (JP); Toshiba Electronic Devices & Storage Corporation, Minato-ku (JP)

( * ) Notice: Subject to any disclaimer, the term of this patent is extended or adjusted under 35 U.S.C. 154(b) by 0 days.

(21) Appl. No.: 16/570,201

(22) Filed: Sep. 13, 2019

(65) Prior Publication Data
US 2020/0303525 A1    Sep. 24, 2020

(30) Foreign Application Priority Data

Mar. 20, 2019 (JP) .............................. JP2019-052615

(51) Int. Cl.
 *H01L 29/22* (2006.01)
 *H01L 29/201* (2006.01)
 (Continued)

(52) U.S. Cl.
 CPC ........ *H01L 29/7397* (2013.01); *H01L 29/045* (2013.01); *H01L 29/0696* (2013.01);
 (Continued)

(58) Field of Classification Search
 CPC ........... H01L 29/7827; H01L 29/66325; H01L 29/4236; H01L 29/7395; H01L 29/0839; H01L 29/7397; H01L 29/4238
 See application file for complete search history.

(56) References Cited

U.S. PATENT DOCUMENTS 5,751,024 A   5/1998 Takahashi
6,114,727 A * 9/2000 Ogura ................. H01L 29/0696
                                                257/212

(Continued)

FOREIGN PATENT DOCUMENTS

JP   08-31 6479 A    11/1996
JP     3288218 A      3/2002

(Continued)

OTHER PUBLICATIONS

U.S. Appl. No. 16/284,091, filed Feb. 25, 2019, Yoko Iwakaji, et al.

*Primary Examiner* — Brian Turner
(74) *Attorney, Agent, or Firm* — Oblon, McClelland, Maier & Neustadt, L.L.P.

(57) ABSTRACT

A semiconductor device of an embodiment includes semiconductor layer including first and second planes, and in order from the first plane's side to the second plane's side, first region of first conductivity type, second region of second conductivity type, third region of second conductivity type having second conductivity type impurity concentration higher than the second region, fourth region of first conductivity type, and fifth region of second conductivity type, and including first and second trench on the first plane's side; first gate electrode in the first trench; first gate insulating film in contact with the fifth semiconductor region; second gate electrode in the second trench; second gate insulating film; a first electrode on the first plane; second electrode on the second plane; first gate electrode pad connected to the first gate electrode; and second gate electrode pad connected to the second gate electrode.

11 Claims, 13 Drawing Sheets

(51) Int. Cl.
    *H01L 29/778* (2006.01)
    *H01L 29/205* (2006.01)
    *H01L 29/739* (2006.01)
    *H03K 17/06* (2006.01)
    *H03K 17/04* (2006.01)
    *H01L 29/04* (2006.01)
    *H01L 29/08* (2006.01)
    *H01L 29/36* (2006.01)
    *H01L 29/10* (2006.01)
    *H01L 29/06* (2006.01)
    *H01L 29/423* (2006.01)
    *H01L 29/417* (2006.01)

(52) U.S. Cl.
    CPC ...... *H01L 29/0804* (2013.01); *H01L 29/0821* (2013.01); *H01L 29/1004* (2013.01); *H01L 29/1095* (2013.01); *H01L 29/36* (2013.01); *H01L 29/41708* (2013.01); *H01L 29/4236* (2013.01); *H03K 17/0406* (2013.01); *H03K 17/06* (2013.01)

(56) References Cited

U.S. PATENT DOCUMENTS

| | | |
|---|---|---|
| 6,809,349 B2 | 10/2004 | Yamaguchi et al. |
| 8,614,483 B2 | 12/2013 | Tanabe et al. |
| 2009/0189181 A1* | 7/2009 | Koyama ............... H01L 29/402 257/139 |
| 2014/0209972 A1* | 7/2014 | Sumitomo .......... H01L 29/4238 257/140 |
| 2015/0069461 A1* | 3/2015 | Misu ................... H01L 29/1095 257/139 |
| 2015/0091055 A1 | 4/2015 | Gejo et al. |
| 2015/0129927 A1 | 5/2015 | Sumitomo et al. |
| 2017/0317175 A1 | 11/2017 | Naito |
| 2018/0097061 A1 | 4/2018 | Mimura et al. |
| 2018/0108738 A1 | 4/2018 | Naito |
| 2019/0027592 A1 | 1/2019 | Tanabe |
| 2020/0083879 A1* | 3/2020 | Tanaka .................... H01L 27/04 |
| 2020/0091326 A1 | 3/2020 | Iwakaji et al. |

FOREIGN PATENT DOCUMENTS

| | | |
|---|---|---|
| JP | 3927111 B2 | 6/2007 |
| JP | 2013-098415 A | 5/2013 |
| JP | 2013-251296 A | 12/2013 |
| JP | 5594276 B2 | 9/2014 |
| JP | 2015-072950 A | 4/2015 |
| JP | 5742672 B2 | 7/2015 |
| JP | 5916978 B2 | 5/2016 |
| JP | 2016-181617 A | 10/2016 |
| JP | 6064371 B2 | 1/2017 |
| JP | 2017-143195 A | 8/2017 |
| JP | 2018-190948 A | 11/2018 |
| JP | 2020-47790 A | 3/2020 |
| WO | WO 2017/010393 A1 | 1/2017 |

* cited by examiner

FIG.7

SEMICONDUCTOR DEVICE AND SEMICONDUCTOR CIRCUIT

CROSS-REFERENCE TO RELATED APPLICATION

This application is based upon and claims the benefit of priority from Japanese Patent Application No. 2019-052615, filed on Mar. 20, 2019, the entire contents of which are incorporated herein by reference.

FIELD

Embodiments described herein relate generally to a semiconductor device and a semiconductor circuit.

BACKGROUND

As an example of a semiconductor device for electric power, there is an insulated gate bipolar transistor (IGBT). In the IGBT, for example, a collector region of p-type, a drift region of n-type, and a base region of p-type are provided on a collector electrode. Then, in a trench that penetrates the base region of p-type and reaches the drift region of n-type, a gate electrode is provided sandwiching a gate insulating film between the gate electrode and the regions. Further, in a region adjacent to the trench on the surface of the base region of p-type, an emitter region of n-type is provided connected to an emitter electrode.

In the IGBT, a positive voltage greater than or equal to a threshold voltage is applied to the gate electrode, whereby a channel is formed in the base region of p-type. Then, electrons are injected from the emitter region of n-type to the drift region of n-type, and simultaneously holes are injected from the collector region to the drift region of n-type. As a result, a current having electrons and holes as carriers flows between the collector electrode and the emitter electrode.

To reduce an on-resistance of the IGBT, it is effective to increase a carrier concentration of the drift region of n-type in the on state. On the other hand, when the carrier concentration is increased, discharge of carriers in the drift region of n-type is delayed at the time of turn-off of the IGBT, then the turn-off time is lengthened and the switching loss increases.

Double gate drive has been proposed as a method for achieving both reduction of the on-resistance and reduction of the switching loss. The double gate drive is a technology for shortening the switching time of the IGBT and reducing the switching loss by making a drive system of the gate into two systems and changing the drive timing of the two gates. Thus, it becomes possible to achieve both the reduction of the on-resistance and the reduction of the switching loss.

BRIEF DESCRIPTION OF THE DRAWINGS

FIG. 7 is a schematic sectional view of part of a semiconductor device of a third embodiment;

DETAILED DESCRIPTION

Figure 1:
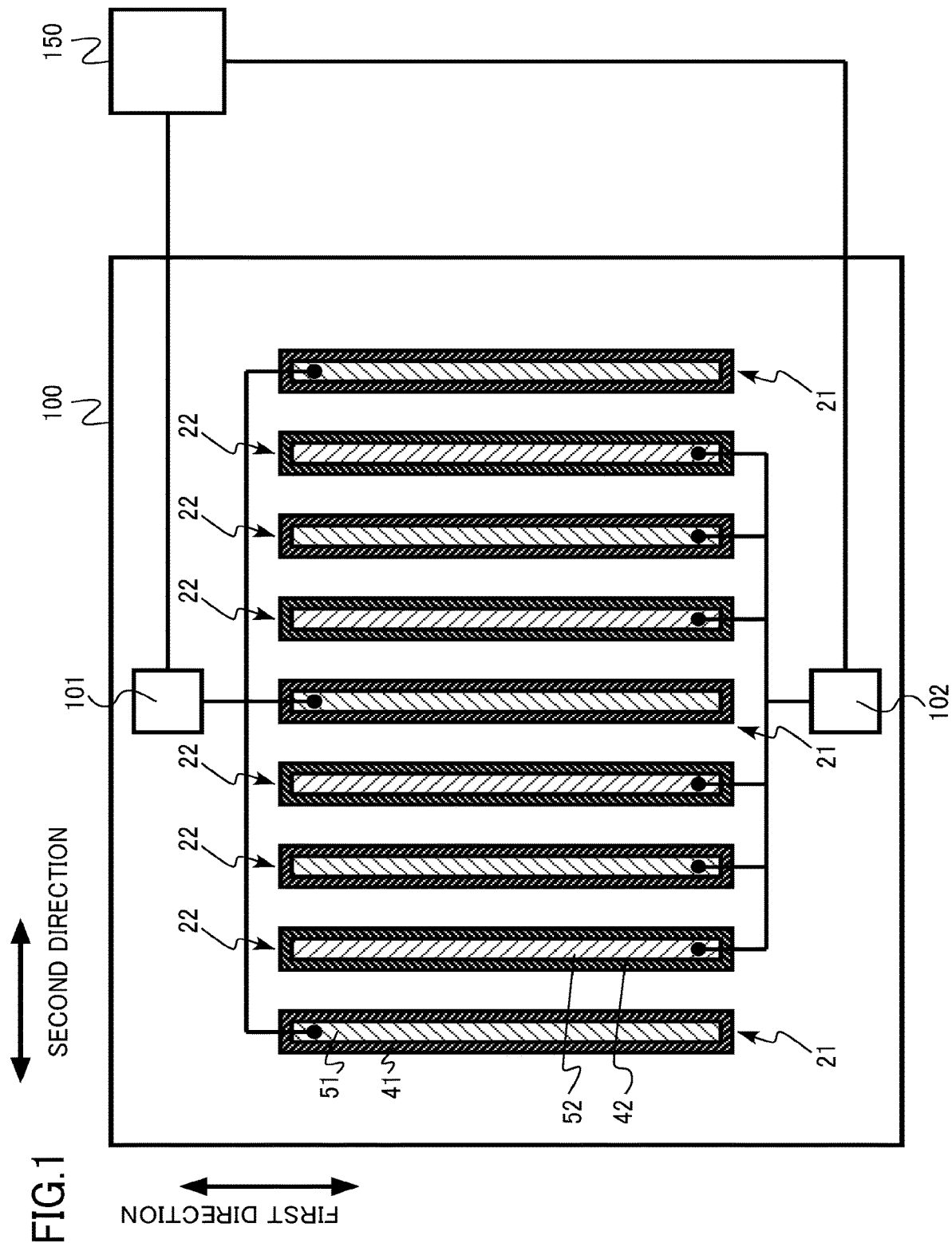
FIG. 1 is a schematic view of a semiconductor circuit of a first embodiment.

Hereinafter, embodiments of the present disclosure will be described with reference to the drawings. In the following description, the same or similar members and the like are denoted by the same reference numerals, and the explanation of the members and the like once described is omitted as appropriate.

In the present specification, when there are notations of $n^+$-type, n-type, and $n^-$-type, it means that an impurity concentration of n-type is lowered in the order of $n^+$-type, n-type, and $n^-$-type. In addition, when there are notations of $p^+$-type, p-type, and $p^-$-type, it means that an impurity concentration of p-type is lowered in the order of $p^+$-type, p-type, and $p^-$-type.

In the present specification, a distribution and an absolute value of impurity concentration in a semiconductor region can be measured by using, for example, secondary ion mass spectrometry (SIMS). A relative magnitude relationship between impurity concentrations of two semiconductor regions can be determined by using, for example, scanning capacitance microscopy (SCM). A distribution and an absolute value of impurity concentration can be measured by using, for example, spreading resistance analysis (SRA). In SCM and SRA, a relative magnitude relationship and absolute values of carrier concentrations in semiconductor regions are obtained. By assuming an activation rate of impurities, it is possible to obtain a relative magnitude relationship between impurity concentrations of two semiconductor regions, a distribution of impurity concentration, and an absolute value of impurity concentration, from measurement results of SCM and SRA.

First Embodiment

A semiconductor device of a first embodiment includes: a semiconductor layer including a first plane and a second plane facing the first plane, the semiconductor layer including a first semiconductor region of first conductivity type, a second semiconductor region of second conductivity type provided between the first semiconductor region and the first plane, a third semiconductor region of second conductivity type provided between the second semiconductor region and the first plane and having a second conductivity type impurity concentration higher than a second conductivity type impurity concentration of the second semiconductor region, a fourth semiconductor region of first conductivity type provided between the third semiconductor region and the first plane, a fifth semiconductor region of second conductivity type provided between the fourth semiconductor region and the first plane, a first trench provided on a side of the first plane, a first distance between the second plane and the first trench being smaller than a distance between the second plane and the fourth semiconductor region, and a second trench provided on a side of the first plane, a second distance between the second plane and the second trench being smaller than the distance between the second plane and the fourth semiconductor region; a first gate electrode provided in the first trench; a first gate insulating film provided between the first gate electrode and the fourth semiconductor region, and between the first gate electrode and the fifth semiconductor region, and in contact with the fifth semiconductor region; a second gate electrode provided in the second trench; a second gate insulating film provided between the second gate electrode and the third semiconductor region, and between the second gate electrode and the fourth semiconductor region; a first electrode provided on a first plane side of the semiconductor layer and electrically connected to the fifth semiconductor region; a second electrode provided on a second plane side of the semiconductor layer and electrically connected to the first semiconductor region; a first gate electrode pad provided on the first plane side of the semiconductor layer and electrically connected to the first gate electrode, a first gate voltage being applied to the first gate electrode pad; and a second gate electrode pad provided on the first plane side of the semiconductor layer and electrically connected to the second gate electrode, a second gate voltage being applied to the second gate electrode pad.

A semiconductor circuit of the first embodiment includes: the above-described semiconductor device; and a control circuit configured to drive the semiconductor device, the control circuit changing the second gate voltage from a first voltage to a second voltage before changing the first gate voltage from a turn-on voltage to a turn-off voltage, wherein the second voltage is a negative voltage when the first conductivity type is p-type, and is a positive voltage when the first conductivity type is n-type.

The semiconductor circuit of the first embodiment includes a semiconductor device and a control circuit configured to control and drive the semiconductor device.

The semiconductor device of the first embodiment is an IGBT 100 of trench gate type including the gate electrodes in the trenches formed in the semiconductor layer. The IGBT 100 is an IGBT capable of double gate drive. Hereinafter, a case will be described as an example where the first conductivity type is p-type and the second conductivity type is n-type. The control circuit of the first embodiment is a gate driver circuit 150.

Figure 2:
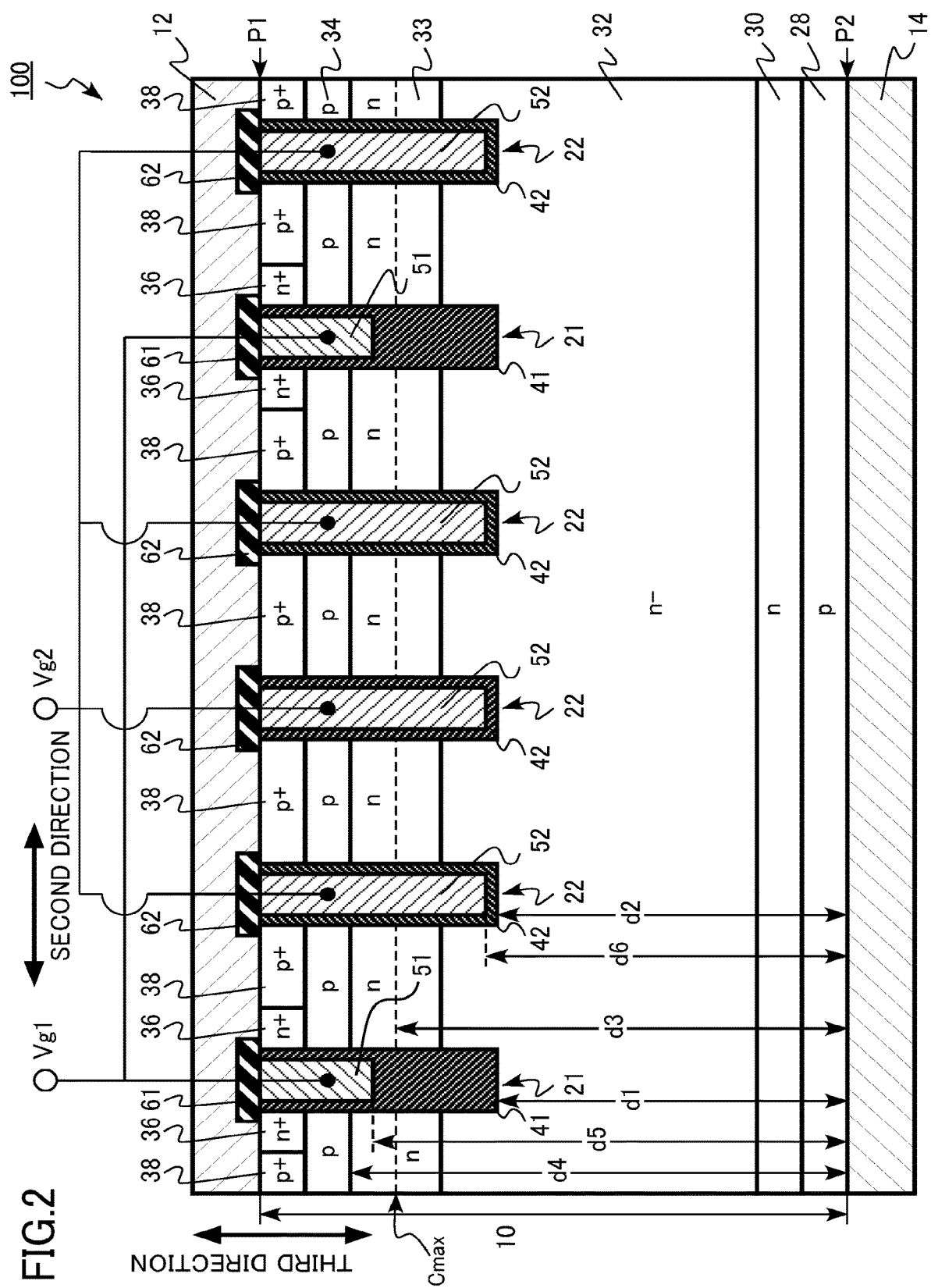
FIG. 2 is a schematic sectional view of part of a semiconductor device of the first embodiment.
Figure 3:
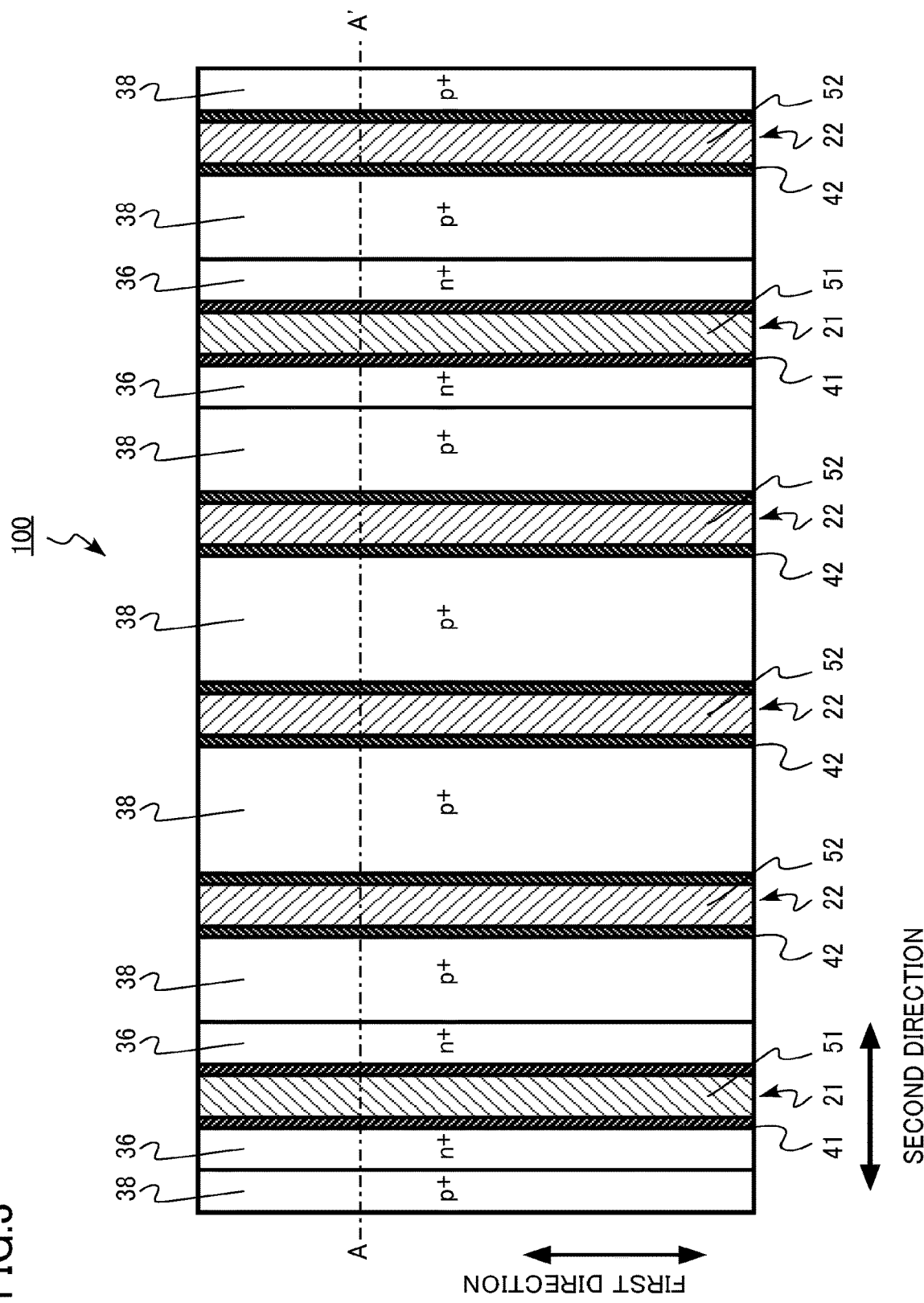
FIG. 3 is a schematic top view of part of the semiconductor device of the first embodiment.

FIG. 1 is a schematic view of the semiconductor circuit of the first embodiment. FIG. 1 illustrates a disposition and a connection relationship of the first trench, the second trench, the first gate electrode, the second gate electrode, the first gate electrode pad, the second gate electrode pad, and the control circuit. FIG. 2 is a schematic sectional view of part of the semiconductor device of the first embodiment. FIG. 3 is a schematic top view of part of the semiconductor device of the first embodiment. FIG. 3 is a top view on a first plane P1. FIG. 2 is an AA' cross section of FIG. 3.

The IGBT 100 of the first embodiment includes a semiconductor layer 10, an emitter electrode 12 (first electrode), a collector electrode 14 (second electrode), a first gate insulating film 41, a second gate insulating film 42, a first gate electrode 51, a second gate electrode 52, a first insulating layer 61, a second insulating layer 62, a first gate electrode pad 101, and a second gate electrode pad 102.

In the semiconductor layer 10, provided are a first gate trench 21 (first trench), a second gate trench 22 (second trench), a collector region 28 (first semiconductor region), a buffer region 30, a drift region 32 (second semiconductor region), a barrier region 33 (third semiconductor region), a base region 34 (fourth semiconductor region), an emitter region 36 (fifth semiconductor region), and a contact region 38.

The semiconductor layer 10 includes the first plane P1 and a second plane P2 facing the first plane P1. The semiconductor layer 10 is, for example, single crystal silicon. The film thickness of the semiconductor layer 10 is, for example, greater than or equal to 40 µm and less than or equal to 700 µm.

In the present specification, one direction parallel to the first plane P1 is referred to as a first direction. A direction parallel to the first plane P1 and orthogonal to the first direction is referred to as a second direction. A normal direction of the first plane P1 is referred to as a third direction. In the present specification, "depth" is defined as a distance in the third direction with reference to the first plane P1.

The emitter electrode 12 is provided on the first plane P1's side of the semiconductor layer 10. At least a part of the emitter electrode 12 is in contact with the first plane P1 of the semiconductor layer 10. The emitter electrode 12 is, for example, a metal.

The emitter electrode 12 is electrically connected to the emitter region 36 and the contact region 38. An emitter voltage is applied to the emitter electrode 12. The emitter voltage is, for example, 0 V.

The collector electrode 14 is provided on the second plane P2's side of the semiconductor layer 10. At least a part of the collector electrode 14 is in contact with the second plane P2 of the semiconductor layer 10. The collector electrode 14 is, for example, a metal.

The collector electrode 14 is electrically connected to the collector region 28 of p-type. A collector voltage is applied to the collector electrode 14. The collector voltage is, for example, greater than or equal to 200 V and less than or equal to 6500 V.

The collector region 28 is a semiconductor region of p-type. The collector region 28 is electrically connected to the collector electrode 14. The collector region 28 is in contact with the collector electrode 14.

The collector region 28 becomes a supply source of holes in the on state of the IGBT 100.

The buffer region 30 is a semiconductor region of n-type. The buffer region 30 is provided between the collector region 28 and the first plane P1. The buffer region 30 has a function of suppressing extension of a depletion layer in the off state of the IGBT 100. A configuration can also be made in which the buffer region 30 is not provided.

The drift region 32 is a semiconductor region of n⁻-type. The drift region 32 is provided between the collector region 28 and the first plane P1. The drift region 32 is provided between the buffer region 30 and the first plane P1. An n-type impurity concentration of the drift region 32 is lower than an n-type impurity concentration of the buffer region 30.

The drift region 32 becomes a path of an on-state current in the on state of the IGBT 100. The drift region 32 has a function of depletion in the off state of the IGBT 100, and maintaining the breakdown voltage of the IGBT 100.

The barrier region 33 is a semiconductor region of n-type. The barrier region 33 is provided between the drift region 32 and the first plane P1. The barrier region 33 is provided between the drift region 32 and the base region 34. An n-type impurity concentration of the barrier region 33 is higher than the n-type impurity concentration of the drift region 32. The maximum concentration of n-type impurities of the barrier region 33 is preferably greater than or equal to 100 times the n-type impurity concentration of the drift region 32. A maximum concentration position (Cmax in FIG. 2) of n-type impurities in the barrier region 33 is positioned, for example, between the first gate trench 21 and the second gate trench 22, and between the second gate trench 22 and another second gate trench 22.

The barrier region 33 having an n-type impurity concentration higher than that of the drift region 32 is provided on the first plane P1's side, whereby discharge is limited of holes in the drift region 32 to the emitter electrode 12 in the on state of the IGBT 100. Thus, a carrier concentration is increased on the first plane P1's side of the drift region. Therefore, the barrier region 33 has a function of reducing an on-resistance of the IGBT 100.

The drift region 32 and the barrier region 33 are the same n-type impurity region, and the n-type impurity concentration is increased continuously from the drift region 32 toward the barrier region 33.

The base region 34 is a semiconductor region of p-type. The base region 34 is provided between the drift region 32 and the first plane P1. The base region 34 is provided between the barrier region 33 and the first plane P1.

The depth of the base region 34 is, for example, less than or equal to 4 μm. In a region of the base region 34 facing the first gate electrode 51, an inversion layer is formed in the on state of the IGBT 100. The base region 34 functions as a channel region of a transistor.

The emitter region 36 is a semiconductor region of $n^+$-type. The emitter region 36 is provided between the base region 34 and the first plane P1. The emitter region 36 extends in the first direction on the first plane P1.

The emitter region 36 is in contact with the first gate insulating film 41. The emitter region 36 is separated from the second gate insulating film 42. The emitter region 36 is not in contact with the second gate insulating film 42. An n-type impurity concentration of the emitter region 36 is higher than the n-type impurity concentration of the drift region 32.

The emitter region 36 is electrically connected to the emitter electrode 12. The emitter region 36 is in contact with the emitter electrode 12. The emitter region 36 becomes a supply source of electrons when a transistor including the first gate electrode 51 is in the on state.

The contact region 38 is a semiconductor region of $p^+$-type. The contact region 38 is provided between the base region 34 and the first plane P1. The contact region 38 extends in the first direction on the first plane P1. The contact region 38 is electrically connected to the emitter electrode 12.

The first gate trench 21 extends, on the first plane P1, in the first direction parallel to the first plane P1, as illustrated in FIG. 3. The first gate trench 21 has a stripe shape. A plurality of the first gate trenches 21 is repeatedly disposed in the second direction orthogonal to the first direction.

The first gate trench 21 penetrates the base region 34 and the barrier region 33 and reaches the drift region 32. The depth of the first gate trench 21 is, for example, greater than or equal to 4 μm and less than or equal to 8 μm.

The first gate electrode 51 is provided in the first gate trench 21. The first gate electrode 51 is, for example, a semiconductor or a metal. The first gate electrode 51 is, for example, amorphous silicon or polycrystalline silicon containing n-type impurities or p-type impurities. The first gate electrode 51 is electrically connected to the first gate electrode pad 101.

The first gate insulating film 41 is provided between the first gate electrode 51 and the semiconductor layer 10. The first gate insulating film 41 is provided between the first gate electrode 51 and the drift region 32, between the first gate electrode 51 and the barrier region 33, between the first gate electrode 51 and the base region 34, and between the first gate electrode 51 and the emitter region 36. The first gate insulating film 41 is in contact with the drift region 32, the barrier region 33, the base region 34, and the emitter region 36. The first gate insulating film 41 is, for example, silicon oxide.

The second gate trench 22 extends, on the first plane P1, in the first direction parallel to the first plane P1, as illustrated in FIG. 3. The second gate trench 22 has a stripe shape. A plurality of the second gate trenches 22 is repeatedly disposed in the second direction orthogonal to the first direction.

The second gate trench 22 penetrates the base region 34 and the barrier region 33 and reaches the drift region 32. The depth of the second gate trench 22 is, for example, greater than or equal to 4 μm and less than or equal to 8 μm.

The second gate electrode 52 is provided in the second gate trench 22. The second gate electrode 52 is, for example, a semiconductor or a metal. The second gate electrode 52 is, for example, amorphous silicon or polycrystalline silicon containing n-type impurities or p-type impurities. The second gate electrode 52 is electrically connected to the second gate electrode pad 102. The first gate electrode 51 has a first area in a cross-section perpendicular to the first plane P1 and the first direction, and the second gate electrode 52 has a second area different from the first area in the cross-section.

The second gate insulating film 42 is provided between the second gate electrode 52 and the semiconductor layer 10. The second gate insulating film 42 is provided between the second gate electrode 52 and the drift region 32, between the second gate electrode 52 and the barrier region 33, between the second gate electrode 52 and the base region 34, and between the second gate electrode 52 and the contact region 38. The second gate insulating film 42 is in contact with the drift region 32, the barrier region 33, and the base region 34. The second gate insulating film 42 is not in contact with the emitter region 36. The second gate insulating film 42 is separated from the emitter region 36. The second gate insulating film 42 is, for example, silicon oxide.

Note that, a configuration can also be made in which the second gate insulating film 42 is in contact with the emitter region 36 provided between the first gate trench 21 and the second gate trench 22.

Three second gate trenches 22 are sandwiched between two first gate trenches 21.

The first gate trench 21 and the second gate trench 22 have the same shape. A first distance (d1 in FIG. 2) between the second plane P2 and the first gate trench 21 and a second distance (d2 in FIG. 2) between the second plane P2 and the second gate trench 22 are substantially the same as each other. In other words, the depth of the first gate trench 21 and the depth of the second gate trench 22 are substantially the same as each other.

The first distance d1 is smaller than a distance (d4 in FIG. 2) between the second plane and the base region 34. The second distance d2 is smaller than the distance d4 between the second plane and the base region 34. In other words, the depth of the first gate trench 21 is deeper than the depth of the base region 34. The depth of the second gate trench 22 is deeper than the depth of the base region 34.

The first distance d1 is smaller than, for example, a distance (d3 in FIG. 2) between the second plane P2 and the maximum concentration position Cmax of n-type impurities in the barrier region 33. The second distance d2 is smaller than, for example, the distance d3 between the second plane P2 and the maximum concentration position Cmax of n-type impurities in the barrier region 33. In other words, the depth of the first gate trench 21 is deeper than the depth of the maximum concentration position Cmax of n-type impurities in the barrier region 33. The depth of the second gate trench 22 is deeper than the depth of the maximum concentration position Cmax of n-type impurities in the barrier region 33.

The thickness of the first gate insulating film 41 between the second plane P2 and the first gate electrode 51 is thicker than the thickness of the second gate insulating film 42 between the second plane P2 and the second gate electrode 52. In other words, the thickness of the first gate insulating film 41 on the bottom face of the first gate trench 21 is thicker than the thickness on the bottom face of the second gate insulating film 42 of the second gate trench 22.

The thickness of the first gate insulating film 41 between the second plane P2 and the first gate electrode 51 is, for example, greater than or equal to three times and less than or equal to 10 times the thickness of the second gate insulating film 42 between the second plane P2 and the second gate electrode 52. In other words, the thickness of the first gate insulating film 41 on the bottom face of the first gate trench 21 is greater than or equal to three times and less than or equal to 10 times the thickness on the bottom face of the second gate insulating film 42 of the second gate trench 22.

The thickness of the first gate insulating film 41 between the second plane P2 and the first gate electrode 51 is thicker than the thickness of the first gate insulating film 41 between the first gate electrode 51 and the base region 34. In other words, the thickness of the first gate insulating film 41 on the bottom face of the first gate trench 21 is thicker than the thickness on the side face of the first gate trench 21.

The thickness of the first gate insulating film 41 between the second plane P2 and the first gate electrode 51 is, for example, greater than or equal to three times and less than or equal to 10 times the thickness of the first gate insulating film 41 between the first gate electrode 51 and the base region 34. In other words, the thickness of the first gate insulating film 41 on the bottom face of the first gate trench 21 is greater than or equal to three times and less than or equal to 10 times the thickness on the side face of the first gate trench 21.

A distance (d5 in FIG. 2) between the second plane P2 and the first gate electrode 51 is, for example, larger than the distance d3 between the second plane P2 and the maximum concentration position Cmax of n-type impurities in the barrier region 33, and smaller than the distance (d4 in FIG. 2) between the second plane P2 and the base region 34.

A distance (d6 in FIG. 2) between the second plane P2 and the second gate electrode 52 is, for example, smaller than the distance d3 between the second plane P2 and the maximum concentration position Cmax of n-type impurities in the barrier region 33.

The first gate insulating film 41 having different thicknesses on the bottom and side faces of the first gate trench 21 can be formed by, for example, filling the bottom of the first gate trench 21 with an insulating film in a first process step, and then forming a thin insulating film in a second process step.

The depth of a portion where the first gate insulating film 41 is thin is shallower than the depth of a portion where the second gate insulating film 42 is thin. The depth of the portion where the first gate insulating film 41 is thin is deeper than the depth of the base region 34.

The first insulating layer 61 is provided between the first gate electrode 51 and the emitter electrode 12. The first insulating layer 61 electrically isolates the first gate electrode 51 from the emitter electrode 12. The first insulating layer 61 is, for example, silicon oxide.

The second insulating layer 62 is provided between the second gate electrode 52 and the emitter electrode 12. The second insulating layer 62 electrically isolates the second gate electrode 52 from the emitter electrode 12. The second insulating layer 62 is, for example, silicon oxide.

The first gate electrode pad 101 is provided on the first plane P1's side of the semiconductor layer 10. The first gate electrode pad 101 is electrically connected to the first gate electrode 51. The first gate electrode pad 101 and the first gate electrode 51 are connected to each other by, for example, metal wiring (not illustrated). A first gate voltage (Vg1) is applied to the first gate electrode pad 101.

The second gate electrode pad 102 is electrically connected to the second gate electrode 52. The second gate electrode pad 102 and the second gate electrode 52 are connected to each other by, for example, metal wiring (not illustrated). A second gate voltage (Vg2) is applied to the second gate electrode pad 102.

The gate driver circuit 150 is provided, for example, in the same module as that of the IGBT 100 or on the same circuit board as that of the IGBT 100. The gate driver circuit 150 has a function of driving the IGBT 100.

The gate driver circuit 150 has a function of applying, to the first gate electrode pad 101 and the second gate electrode pad 102, the desired first gate voltage (Vg1) and the desired second gate voltage (Vg2) at desired timing.

The gate driver circuit 150 changes the second gate voltage (Vg2) from the first voltage to the second voltage before changing the first gate voltage (Vg1) from the turn-on voltage to the turn-off voltage. The second voltage is a negative voltage when the first conductivity type is p-type, and is a positive voltage when the first conductivity type is n-type.

Next, a method will be described of driving the IGBT 100.

Figure 4:
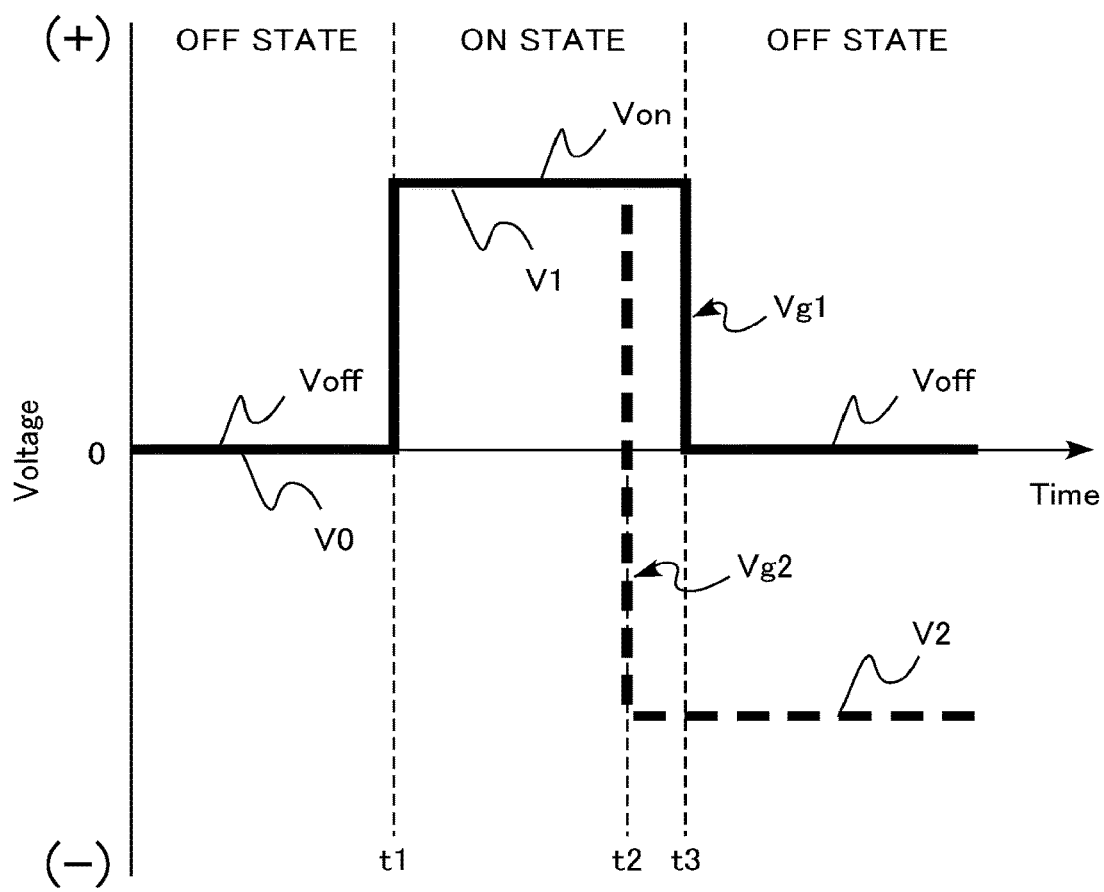
FIG. 4 is an explanatory view of a method of driving the semiconductor device of the first embodiment.

FIG. 4 is an explanatory view of a method of driving the semiconductor device of the first embodiment. FIG. 4 is a timing chart of the first gate voltage (Vg1) applied to the first gate electrode pad 101 and the second gate voltage (Vg2) applied to the second gate electrode pad 102.

Hereinafter, although a structure of the transistor including the first gate electrode 51 and a structure including the second gate electrode 52 are not clearly separated structures, for convenience of operation description, a description will be used of the transistor including the first gate electrode 51.

In the off state of the IGBT 100, for example, an emitter voltage is applied to the emitter electrode 12. The emitter voltage is, for example, 0 V. A collector voltage is applied to the collector electrode 14. The collector voltage is, for example, greater than or equal to 200 V and less than or equal to 6500 V.

In the off state of the IGBT 100, a turn-off voltage (Voff) is applied to the first gate electrode pad 101. The first gate voltage (Vg1) becomes the turn-off voltage (Voff). Thus, the turn-off voltage (Voff) is also applied to the first gate electrode 51.

The turn-off voltage (Voff) is a voltage less than a threshold voltage, at which the transistor including the first gate electrode 51 is not turned on, and is, for example, 0 V or a negative voltage.

In the off state, an n-type inversion layer is not formed in the base region 34 facing the first gate electrode 51 and in contact with the first gate insulating film 41.

In the off state of the IGBT 100, an initial voltage (V0) is applied to the second gate electrode pad 102. The initial voltage (V0) is, for example, a voltage at which a p-type inversion layer is not formed in the drift region 32 facing the second gate electrode 52 and in contact with the second gate insulating film 42. The initial voltage (V0) is, for example, 0 V or a positive voltage.

When the IGBT 100 is turned on (time t1 in FIG. 4), a turn-on voltage (Von) is applied to the first gate electrode pad 101. The first gate voltage (Vg1) becomes the turn-on voltage (Von). The turn-on voltage (Von) is also applied to the first gate electrode 51.

The turn-on voltage (Von) is a positive voltage exceeding the threshold voltage of the transistor including the first gate electrode 51. The turn-on voltage (Von) is, for example, 15 V. By application of the turn-on voltage (Von) to the first gate electrode 51, the transistor including the first gate electrode 51 is turned on.

When the IGBT 100 is turned on (time t1 in FIG. 4), a first voltage (V1) is applied to the second gate electrode pad 102. The second gate voltage (Vg2) becomes the first voltage (V1).

The first voltage (V1) is, for example, a positive voltage higher than the initial voltage (V0). The first voltage (V1) is, for example, equal to the turn-on voltage (Von). The first voltage (V1) is applied to the second gate electrode pad 102, whereby an n-type accumulation layer is formed in the barrier region 33 in contact with the second gate insulating film 42.

When the IGBT 100 is turned off (time t3 in FIG. 4), the turn-off voltage (Voff) is applied to the first gate electrode pad 101. The first gate voltage (Vg1) becomes the turn-off voltage (Voff).

Before the first gate voltage (Vg1) is changed from the turn-on voltage (Von) to the turn-off voltage (Voff), that is, before the time t3, the second gate voltage (Vg2) is changed from the first voltage (V1) to a second voltage (V2). At time t2, the voltage applied to the second gate electrode pad 102 is changed from the first voltage (V1) to the second voltage (V2).

The second voltage (V2) is a negative voltage. The second voltage (V2) is, for example, greater than or equal to −15 V and less than or equal to 0 V. The second voltage (V2) is applied to the second gate electrode pad 102, whereby the p-type inversion layer is formed in the drift region 32 in contact with the second gate insulating film 42 and the barrier region 33 in contact with the second gate insulating film 42.

The time between the time t2 and the time t3 is, for example, greater than or equal to 0.1 microseconds and less than or equal to 3 microseconds. The time between the time t2 and the time t3 is, for example, 1 microsecond.

Next, the function and effect will be described of the semiconductor device of the first embodiment.

To reduce the on-resistance of the IGBT, it is effective to increase a carrier concentration of the drift region in the on state. On the other hand, when discharge of carriers from the drift region is delayed at the time of turn-off of the IGBT, the turn-off time is lengthened and the switching loss increases. Thus, it is desired to achieve both reduction of the on-resistance and reduction of the switching loss.

The IGBT 100 of the first embodiment includes the first gate electrode 51 in the first gate trench 21 and the second gate electrode 52 in the second gate trench 22. The first gate voltage (Vg1) applied to the first gate electrode 51 and the second gate voltage (Vg2) applied to the second gate electrode 52 are controlled independently.

In the IGBT 100, the second gate voltage (Vg2) is set to a negative voltage before the first gate voltage (Vg1) is changed from the turn-on voltage (Von) to the turn-off voltage (Voff). The second gate voltage (Vg2) is set to a negative voltage, whereby the p-type inversion layer is formed in the drift region 32 facing the second gate electrode 52 and in contact with the second gate insulating film 42, and the barrier region 33 in contact with the second gate insulating film 42.

The second gate voltage (Vg2) is set to a negative voltage, whereby the p-type inversion layer can also be formed in the barrier region 33 having the n-type impurity concentration higher than that of the drift region 32.

Holes in the drift region 32 are discharged to the emitter electrode 12 through the p-type inversion layer. Thus, a carrier accumulation amount is reduced on the first plane P1's side of the drift region 32.

When the first gate voltage (Vg1) is changed from the turn-on voltage (Von) to the turn-off voltage (Voff) (time t3 in FIG. 4), the carrier accumulation amount has already been reduced on the first plane P1's side of the drift region 32, so that the turn-off time is shortened. Therefore, the switching loss can be reduced of the IGBT 100.

As described above, the barrier region 33 is provided, whereby the discharge of holes in the drift region 32 to the emitter electrode 12 is limited, in the on state, and the on-resistance is reduced. Further, in the IGBT 100, the first voltage (V1) is applied to the second gate electrode pad 102, whereby the n-type accumulation layer is formed, in the on state, in the barrier region 33 in contact with the second gate insulating film 42. The n-type accumulation layer is formed, whereby the discharge is further limited of holes to the emitter electrode 12 through the barrier region 33. Thus, the on-resistance is further reduced.

Generally, providing the barrier region 33 reduces the on-resistance of the IGBT. However, since the carrier concentration in the drift region is increased, the discharge of holes from the drift region may be delayed and the turn-off time may be lengthened.

In the IGBT 100 of the first embodiment, the p-type inversion layer is formed in the barrier region 33 at the time of turn-off, whereby the discharge of holes from the drift region 32 is promoted, and the turn-off time can be shortened. Therefore, the switching loss can be reduced.

Note that, the first voltage (V1) can also be set to 0 V, for example.

Figure 5:
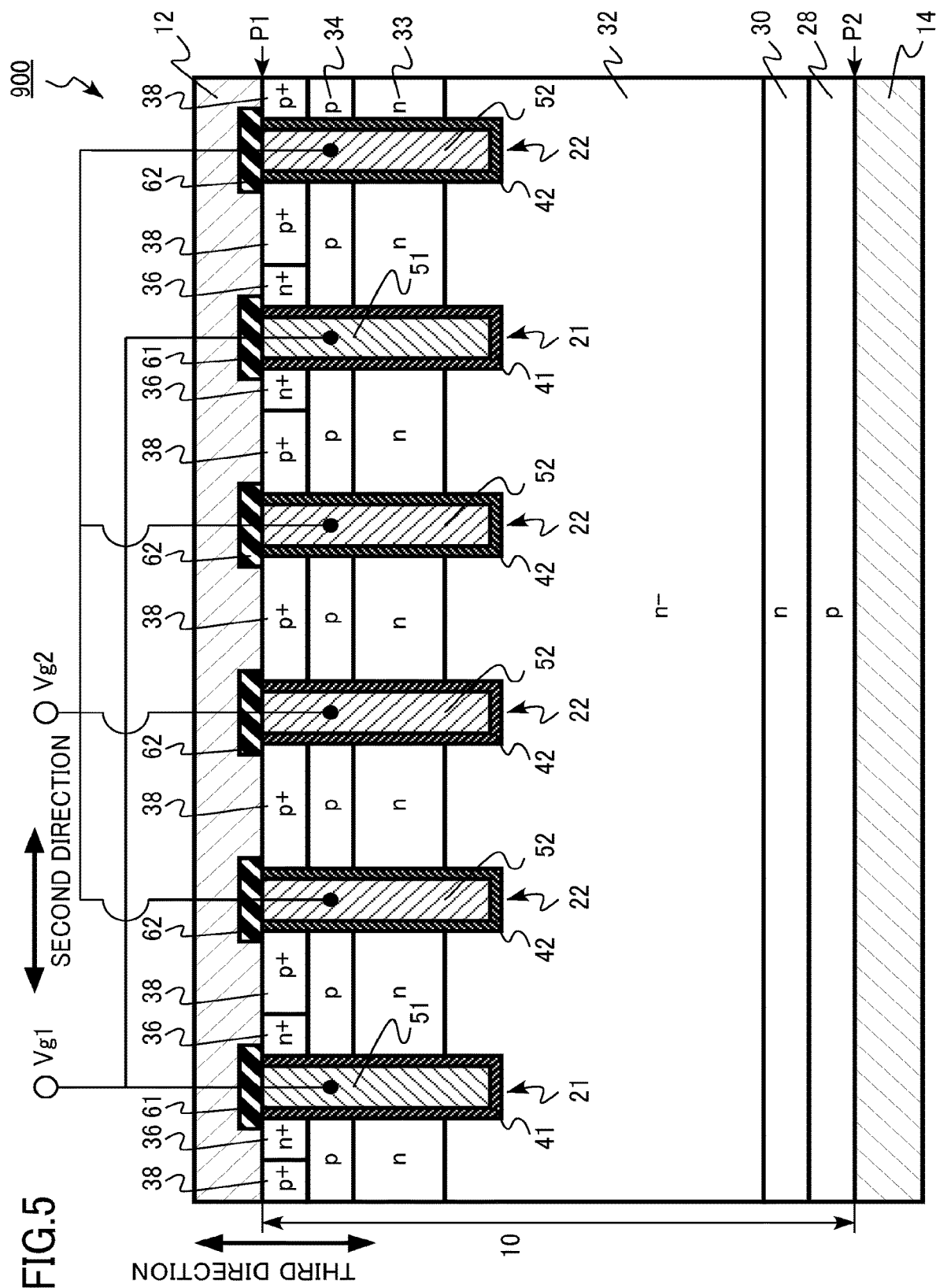
FIG. 5 is a schematic view of a semiconductor device of a comparative example.

FIG. 5 is a schematic view of a semiconductor device of a comparative example. FIG. 5 is a schematic sectional view corresponding to FIG. 2 of the first embodiment.

The semiconductor device of the comparative example is an IGBT 900 of trench gate type including a gate electrode in a trench formed in a semiconductor layer.

The IGBT 900 of the comparative example is different from the IGBT 100 of the first embodiment in that the thickness of the first gate insulating film 41 on the bottom face of the first gate trench 21 is the same as the thickness on the bottom face of the second gate insulating film 42 of the second gate trench 22. In addition, the IGBT 900 of the comparative example is different from the IGBT 100 of the first embodiment in that the thickness of the first gate insulating film 41 on the bottom face of the first gate trench 21 is the same as the thickness on the side face of the first gate trench 21.

In the IGBT 100 of the first embodiment, the thickness of the first gate insulating film 41 on the bottom face of the first gate trench 21 is increased, so that a gate capacitance of the first gate electrode 51 is reduced as compared to the IGBT 900. For this reason, for example, a capacitance between the gate and the collector is reduced as compared to the IGBT 900. Thus, the turn-on time and the turn-off time can be shortened. Therefore, the switching loss can be reduced.

The second gate insulating film 42 between the second gate electrode 52, and the drift region 32 and the barrier region 33 is preferably thin, from a viewpoint of forming the p-type inversion layer in the drift region 32 and the barrier region 33 at the time of turn-off. However, even if the first gate insulating film 41 between the first gate electrode 51, and the drift region 32 and the barrier region 33 becomes thick, no major problem occurs in characteristics of the IGBT.

From a viewpoint of reducing a gate capacitance of the IGBT 100, the thickness of the first gate insulating film 41 between the second plane P2 and the first gate electrode 51 is preferably greater than or equal to three times, more preferably greater than or equal to five times the thickness of the second gate insulating film 42 between the second plane P2 and the second gate electrode 52.

From the viewpoint of reducing the gate capacitance of the IGBT 100, the thickness of the first gate insulating film 41 between the second plane P2 and the first gate electrode 51 is preferably greater than or equal to three times, more preferably greater than or equal to five times the thickness of the first gate insulating film 41 between the first gate electrode 51 and the base region 34, for example.

As described above, according to the IGBT of the first embodiment, the on-resistance can be reduced, and the switching loss can be reduced.

Second Embodiment

A semiconductor device of a second embodiment is different from the first embodiment in that the thickness of the first gate insulating film between the first gate electrode and the third semiconductor region is thicker than the thickness of the second gate insulating film between the second gate electrode and the third semiconductor region. Hereinafter, description overlapping with the first embodiment will be partially omitted.

Figure 6:
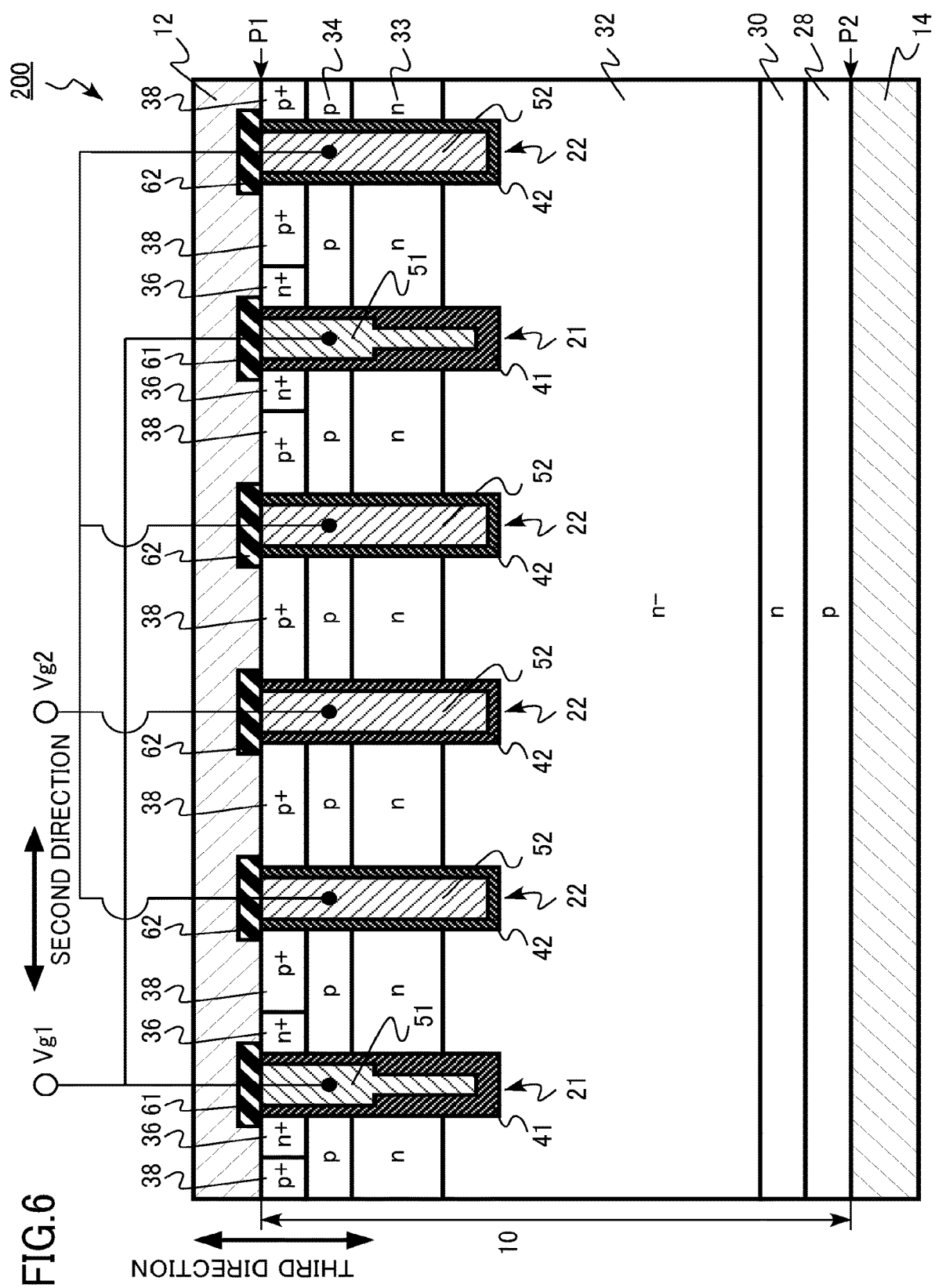
FIG. 6 is a schematic sectional view of part of a semiconductor device of a second embodiment.

FIG. 6 is a schematic sectional view of part of the semiconductor device of the second embodiment.

The semiconductor device of the second embodiment is an IGBT 200 of trench gate type including the gate electrodes in the trenches formed in the semiconductor layer.

The thickness of the first gate insulating film 41 between the first gate electrode 51 and the barrier region (third semiconductor region) of the IGBT 200 is partially thicker than the thickness of the second gate insulating film 42 between the second gate electrode 52 and the barrier region 33.

The thickness of the first gate insulating film 41 between the second plane P2 and the first gate electrode 51 of the IGBT 200 is also thicker than the thickness of the second gate insulating film 42 between the second plane P2 and the second gate electrode 52.

According to the IGBT 200 of the second embodiment, as in the IGBT 100 of the first embodiment, a gate capacitance of the IGBT 200 is reduced. Then, due to a structure in which the bottom of the first gate trench 21 is not completely filled with the first gate insulating film 41, manufacturing becomes easier as compared with the IGBT 100 of the first embodiment.

As described above, according to the IGBT of the second embodiment, the on-resistance can be reduced, and the switching loss can be reduced.

Third Embodiment

A semiconductor device of a third embodiment is different from the second embodiment in that the semiconductor device of the third embodiment includes: a third trench provided on the side of the first plane, the second trench interposed between the third trench and the first trench, a third distance between the second plane and the third trench being smaller than the distance between the second plane and the fourth semiconductor region; and a third gate electrode provided in the third trench and electrically connected to the second gate electrode pad, and the third semiconductor region interposed between the second trench and the third trench is in contact with the first plane. Hereinafter, description overlapping with the first embodiment and the second embodiment will be partially omitted.

Figure 7:
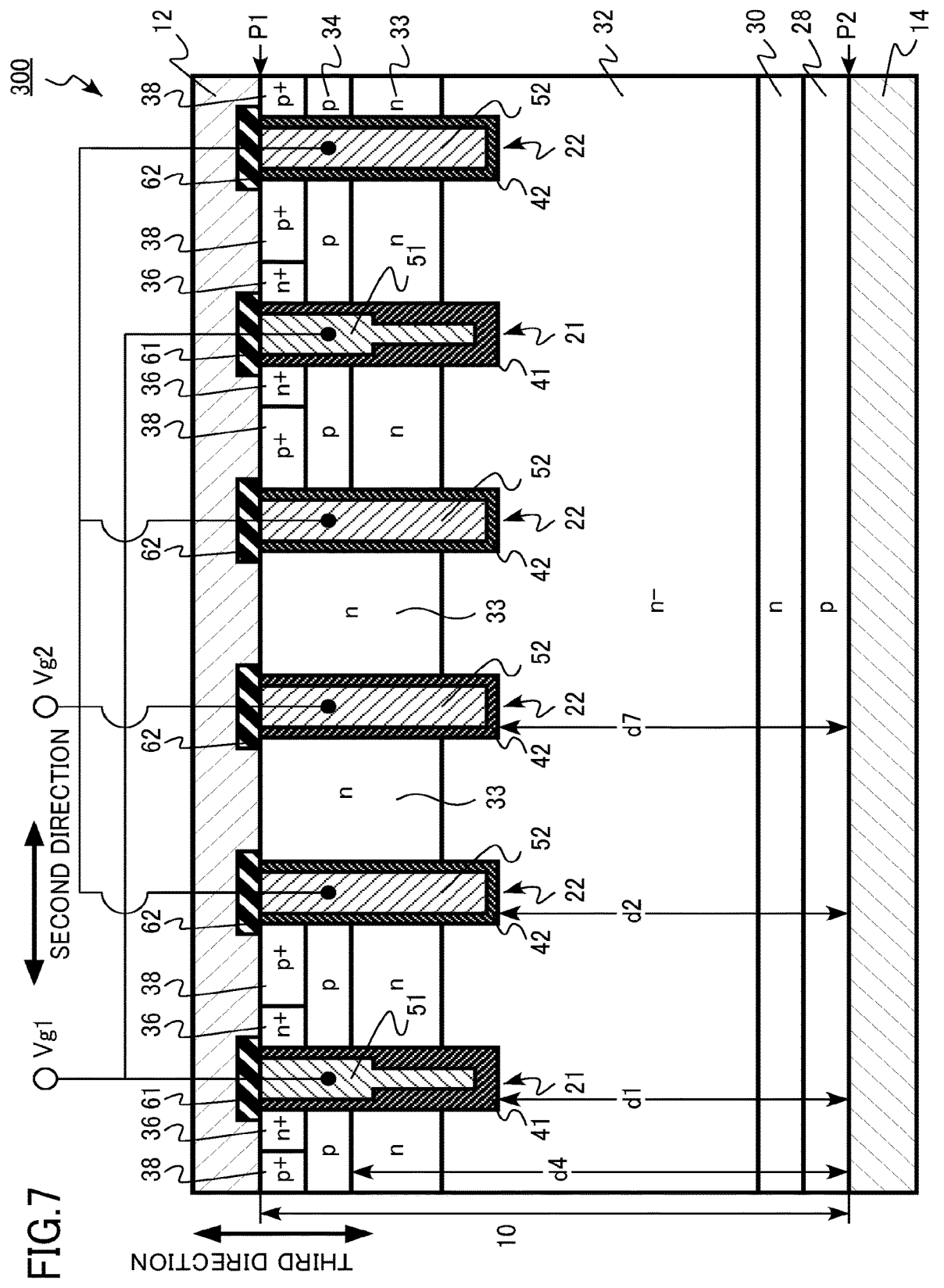

FIG. 7 is a schematic sectional view of part of the semiconductor device of the third embodiment.

The semiconductor device of the third embodiment is an IGBT 300 of trench gate type including the gate electrodes in the trenches formed in the semiconductor layer.

In the IGBT 300, another second gate trench 22 (third trench) is provided sandwiching one of the second gate trenches 22 (second trenches) between the other second gate trench 22 and the first gate trench 21 (first trench). A third distance (d7 in FIG. 7) between the second plane P2 and the other second gate trench 22 (third trench) is smaller than a distance (d4 in FIG. 7) between the second plane and the base region 34.

The second gate trench 22 (second trench) and the other second gate trench 22 (third trench) are adjacent to each other in the second direction.

In the IGBT 300, a second gate electrode 52 (third gate electrode) electrically connected to the second gate electrode pad 102 is provided in the other second gate trench 22 (third trench).

The barrier region 33 between the second gate trench 22 (second trench) and the other second gate trench (third trench) is in contact with the first plane P1. In other words, the base region 34 and the contact region 38 do not exist between the two adjacent second gate trenches 22.

The base region 34 and the contact region 38 do not exist between the two adjacent second gate trenches 22, whereby discharge is further limited of holes in the drift region 32 to the emitter electrode 12 in the on state of the IGBT 300. Thus, a carrier concentration is increased on the first plane P1's side of the drift region 32. Therefore, an on-resistance of the IGBT 300 is further reduced.

According to the IGBT 300 of the third embodiment, a gate capacitance of the IGBT 300 is reduced, as in the IGBT 100 and the IGBT 200 of the first and second embodiments. Then, due to a structure in which the base region 34 and the contact region 38 do not exist between the two adjacent second gate trenches 22, the on-resistance is further reduced.

Note that, a configuration can also be made in which the contact region 38 is provided between the second gate trenches 22. In this case, since the base region 34 does not exist, the barrier region 33 and the contact region 38 are in contact with each other.

As described above, according to the IGBT of the third embodiment, the on-resistance can be reduced, and the switching loss can be reduced.

Fourth Embodiment

A semiconductor device of a fourth embodiment is different from the first embodiment in that the first distance is larger than the second distance. Hereinafter, description overlapping with the first embodiment will be partially omitted.

Figure 8:
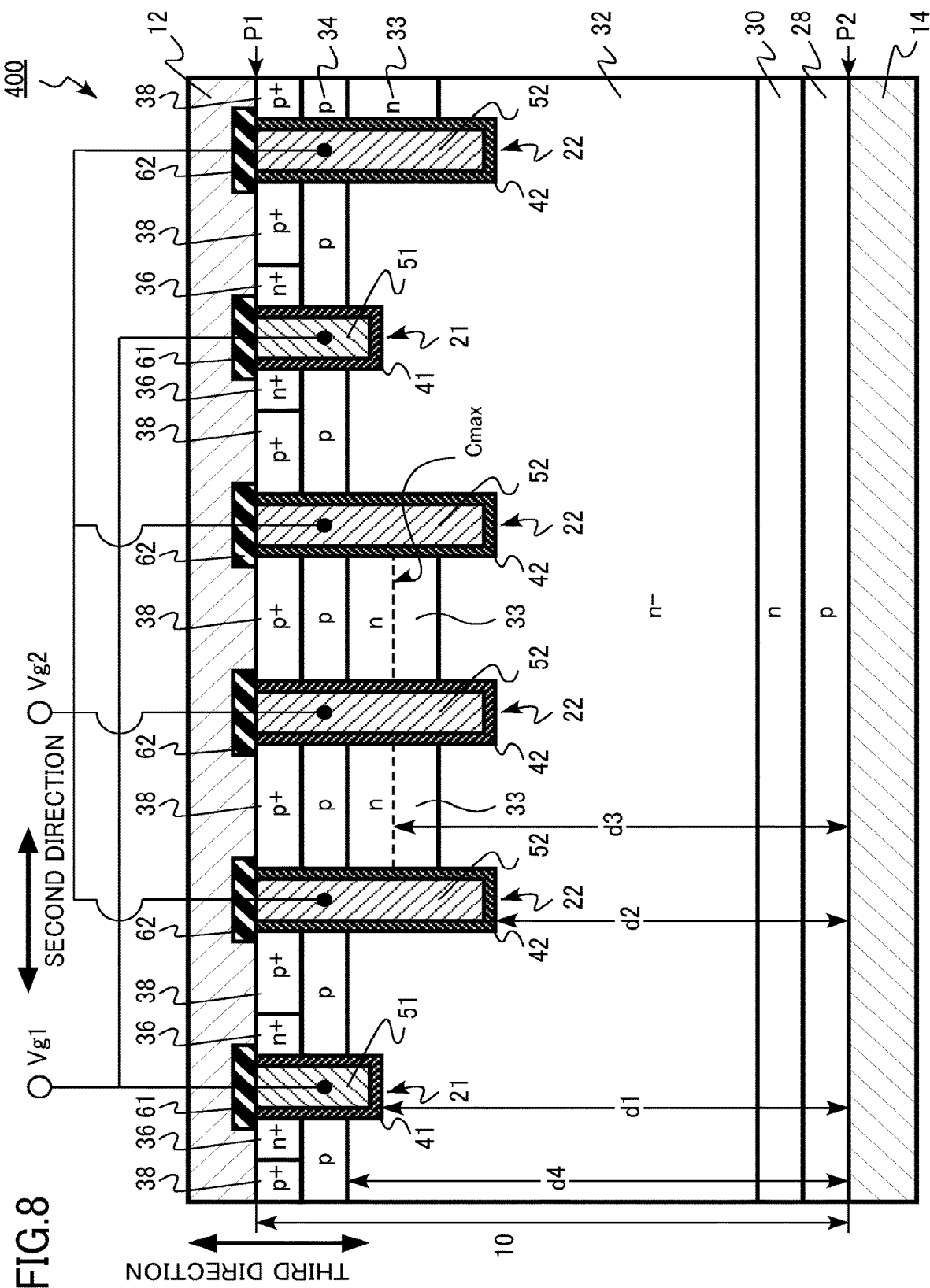
FIG. 8 is a schematic sectional view of part of a semiconductor device of a fourth embodiment.

FIG. 8 is a schematic sectional view of part of the semiconductor device of the fourth embodiment.

The semiconductor device of the fourth embodiment is an IGBT 400 of trench gate type including the gate electrodes in the trenches formed in the semiconductor layer.

A first distance (d1 in FIG. 8) between the second plane P2 and the first gate trench 21 is larger than a second distance (d2 in FIG. 8) between the second plane P2 and the second gate trench 22. In other words, the depth of the first gate trench 21 is shallower than the depth of the second gate trench 22.

The first distance d1 is larger than, for example, a distance (d3 in FIG. 8) between the second plane P2 and a maximum concentration position (Cmax in FIG. 8) of n-type impurities in the barrier region 33. In other words, the depth of the first gate trench 21 is shallower than the depth of the maximum concentration position Cmax of n-type impurities in the barrier region 33.

In addition, the base region 34 (fourth semiconductor region) sandwiched between the first gate trench 21 and the second gate trench 22 is in contact with the drift region 32. In other words, the barrier region 33 is not provided between the second plane P2 and the base region 34 (fourth semiconductor region) sandwiched between the first gate trench 21 and the second gate trench 22. The barrier region 33 is not provided between the first gate trench 21 and the second plane P2.

In the IGBT 400 of the fourth embodiment, the first gate trench 21 is made shallow, whereby an area is reduced of the semiconductor layer 10 facing the first gate electrode 51. For this reason, a gate capacitance of the first gate electrode 51 is reduced. Thus, the turn-on time and the turn-off time can be shortened. Therefore, the switching loss can be reduced.

From a viewpoint of suppressing a decrease in breakdown voltage of the IGBT 400, the barrier region 33 is preferably not provided between the first gate trench 21 and the second plane P2.

As described above, according to the IGBT of the fourth embodiment, the on-resistance can be reduced, and the switching loss can be reduced.

Fifth Embodiment

A semiconductor device of a fifth embodiment is different from the first embodiment in that a distance between the second gate electrode and the first electrode is larger than a distance between the first gate electrode and the first electrode. Hereinafter, description overlapping with the first embodiment will be partially omitted.

Figure 9:
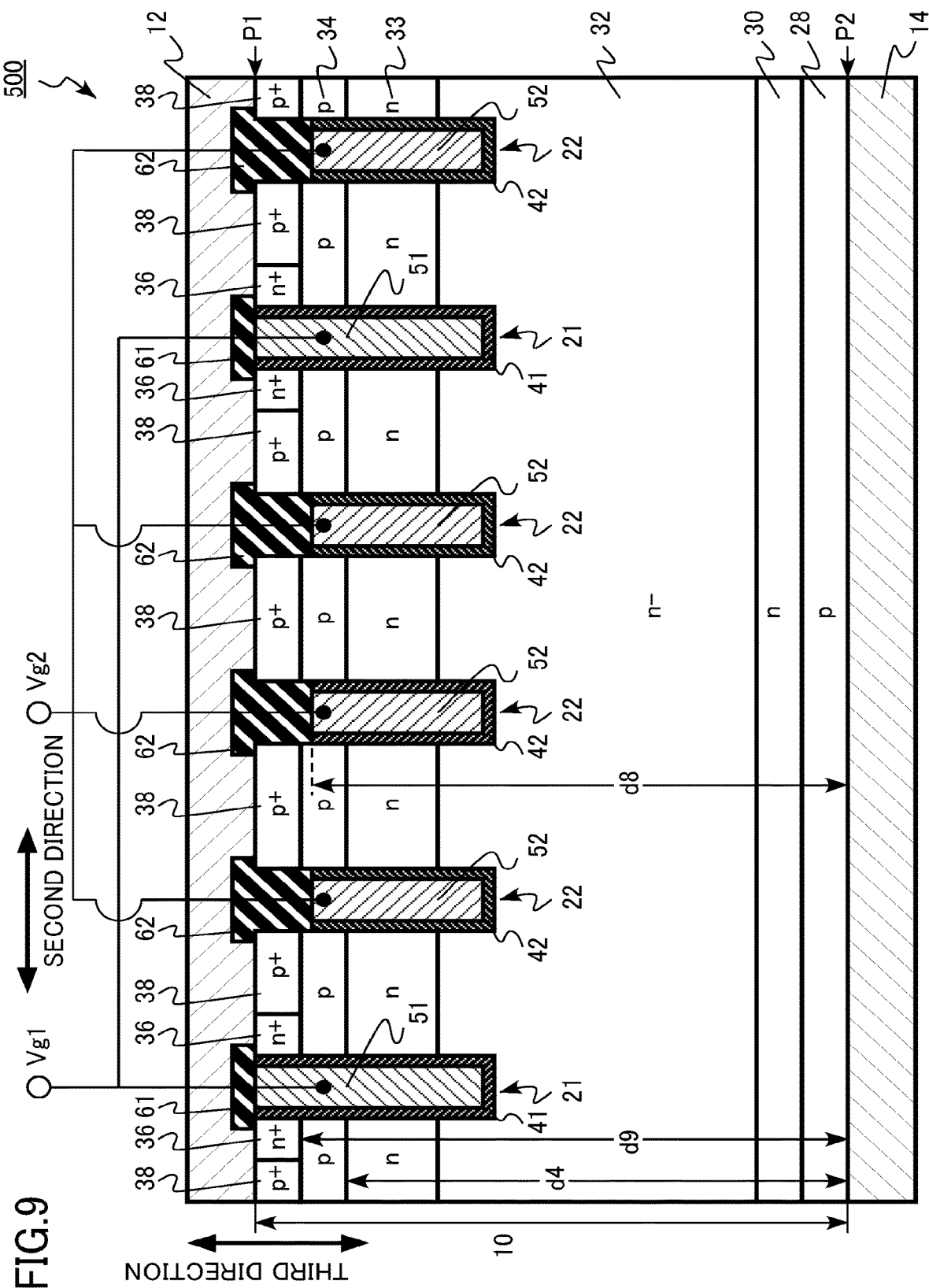
FIG. 9 is a schematic sectional view of part of a semiconductor device of a fifth embodiment.

FIG. 9 is a schematic sectional view of part of the semiconductor device of the fifth embodiment.

The semiconductor device of the fifth embodiment is an IGBT 500 of trench gate type including the gate electrodes in the trenches formed in the semiconductor layer.

In the IGBT 500, a distance between the second gate electrode 52 and the emitter electrode 12 is larger than a distance between the first gate electrode 51 and the emitter electrode 12. The thickness in the third direction of the second insulating layer 62 is larger than the thickness in the third direction of the first insulating layer 61.

A distance (d8 in FIG. 9) between the second plane P2 and the second insulating layer 62 is smaller than, for example, a distance (d9 in FIG. 9) between the second plane P2 and the emitter region 36 (fifth semiconductor region). In addition, the distance (d8 in FIG. 9) between the second plane P2 and the second insulating layer 62 is larger than, for example, a distance (d4 in FIG. 9) between the second plane P2 and the base region 34.

In the IGBT 500, the distance between the second gate electrode 52 and the emitter electrode 12 is larger than the distance between the first gate electrode 51 and the emitter electrode 12, whereby an area is reduced of the semiconductor layer 10 facing the second gate electrode 52. For this reason, a gate capacitance of the second gate electrode 52 is reduced. Thus, the time can be shortened from the time t2 (see FIG. 4) at which the voltage applied to the second gate electrode pad 102 is changed from the first voltage (V1) to the second voltage (V2), to the time t3 (see FIG. 4) at which the turn-off voltage (Voff) is applied to the first gate electrode pad 101.

As described above, according to the IGBT of the fifth embodiment, as in the first embodiment, the first gate voltage (Vg1) applied to the first gate electrode 51 and the second gate voltage (Vg2) applied to the second gate electrode 52 are independently controlled, whereby the on-resistance can be reduced, and the switching loss can be reduced. Further, the time can be shortened from the time t2 (see FIG. 4) at which the voltage applied to the second gate electrode pad 102 is changed from the first voltage (V1) to the second voltage (V2), to the time t3 (see FIG. 4) at which the turn-off voltage (Voff) is applied to the first gate electrode pad 101.

Sixth Embodiment

A semiconductor device of a sixth embodiment is different from the first and fifth embodiments in that the thickness of the second gate insulating film between the second gate electrode and the fourth semiconductor region is thicker than the thickness of the first gate insulating film between the first gate electrode and the fourth semiconductor region. Hereinafter, description overlapping with the first embodiment and the fifth embodiment will be partially omitted.

Figure 10:
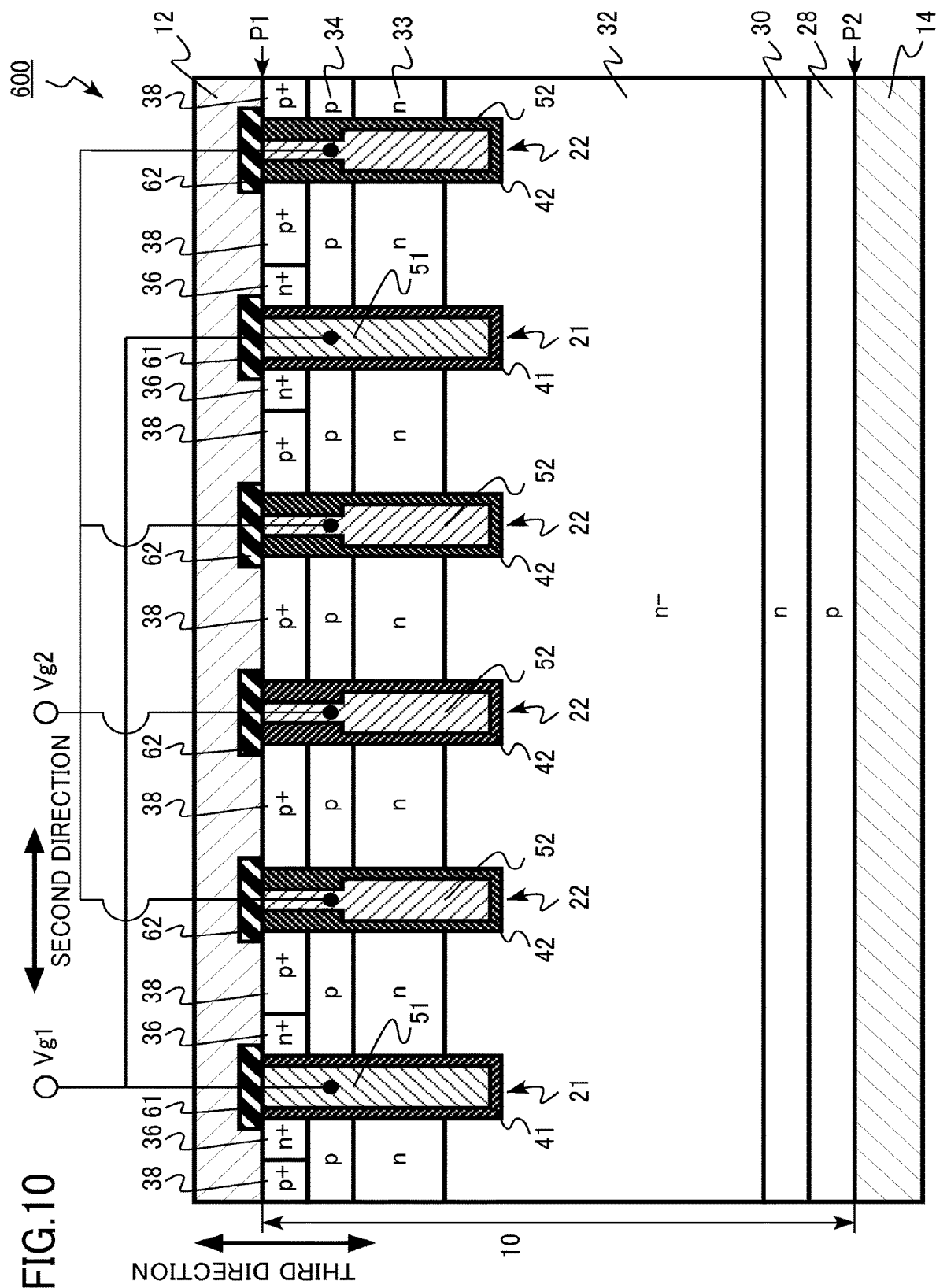
FIG. 10 is a schematic sectional view of part of a semiconductor device of a sixth embodiment.

FIG. 10 is a schematic sectional view of part of the semiconductor device of the sixth embodiment.

The semiconductor device of the sixth embodiment is an IGBT 600 of trench gate type including the gate electrodes in the trenches formed in the semiconductor layer.

In the IGBT 600, the thickness of the second gate insulating film 42 between the second gate electrode 52 and the base region 34 is thicker than the thickness of the first gate insulating film 41 between the first gate electrode 51 and the base region 34. In addition, the thickness of the second gate insulating film 42 between the second gate electrode 52 and the base region 34 is thicker than the thickness of the second gate insulating film 42 between the second gate electrode 52 and the barrier region 33.

The thickness of the second gate insulating film 42 between the second gate electrode 52 and the base region 34 is, for example, greater than or equal to two times and less than or equal to five times the thickness of the first gate insulating film 41 between the first gate electrode 51 and the base region 34. In addition, the thickness of the second gate insulating film 42 between the second gate electrode 52 and the base region 34 is, for example, greater than or equal to two times and less than or equal to five times the thickness of the second gate insulating film 42 between the second gate electrode 52 and the barrier region 33.

In the IGBT 600, the thickness of the second gate insulating film 42 is increased in the upper part of the second gate trench 22, whereby a gate capacitance of the second gate electrode 52 is reduced. Thus, the time can be shortened from the time t2 (see FIG. 4) at which the voltage applied to the second gate electrode pad 102 is changed from the first voltage (V1) to the second voltage (V2), to the time t3 (see FIG. 4) at which the turn-off voltage (Voff) is applied to the first gate electrode pad 101.

According to the IGBT 600, the second gate electrode 52 exists also in the upper part of the second gate trench 22. Thus, compared to the IGBT 500 of the fifth embodiment, for example, it becomes easier to make an electrical connection to the second gate electrode 52.

As described above, according to the IGBT of the sixth embodiment, as in the first embodiment, the first gate voltage (Vg1) applied to the first gate electrode 51 and the second gate voltage (Vg2) applied to the second gate electrode 52 are independently controlled, whereby the on-resistance can be reduced, and the switching loss can be reduced. Further, the time can be shortened from the time t2 (see FIG. 4) at which the voltage applied to the second gate electrode pad 102 is changed from the first voltage (V1) to the second voltage (V2), to the time t3 (see FIG. 4) at which the turn-off voltage (Voff) is applied to the first gate electrode pad 101.

Seventh Embodiment

A semiconductor device of a seventh embodiment is different from the first and fifth embodiments in that the semiconductor device of the seventh embodiment includes a first conductive layer in the second trench, provided between the second gate electrode and the first electrode, separated from the second gate electrode, and electrically connected to the first electrode. Hereinafter, description overlapping with the first embodiment and the fifth embodiment will be partially omitted.

Figure 11:
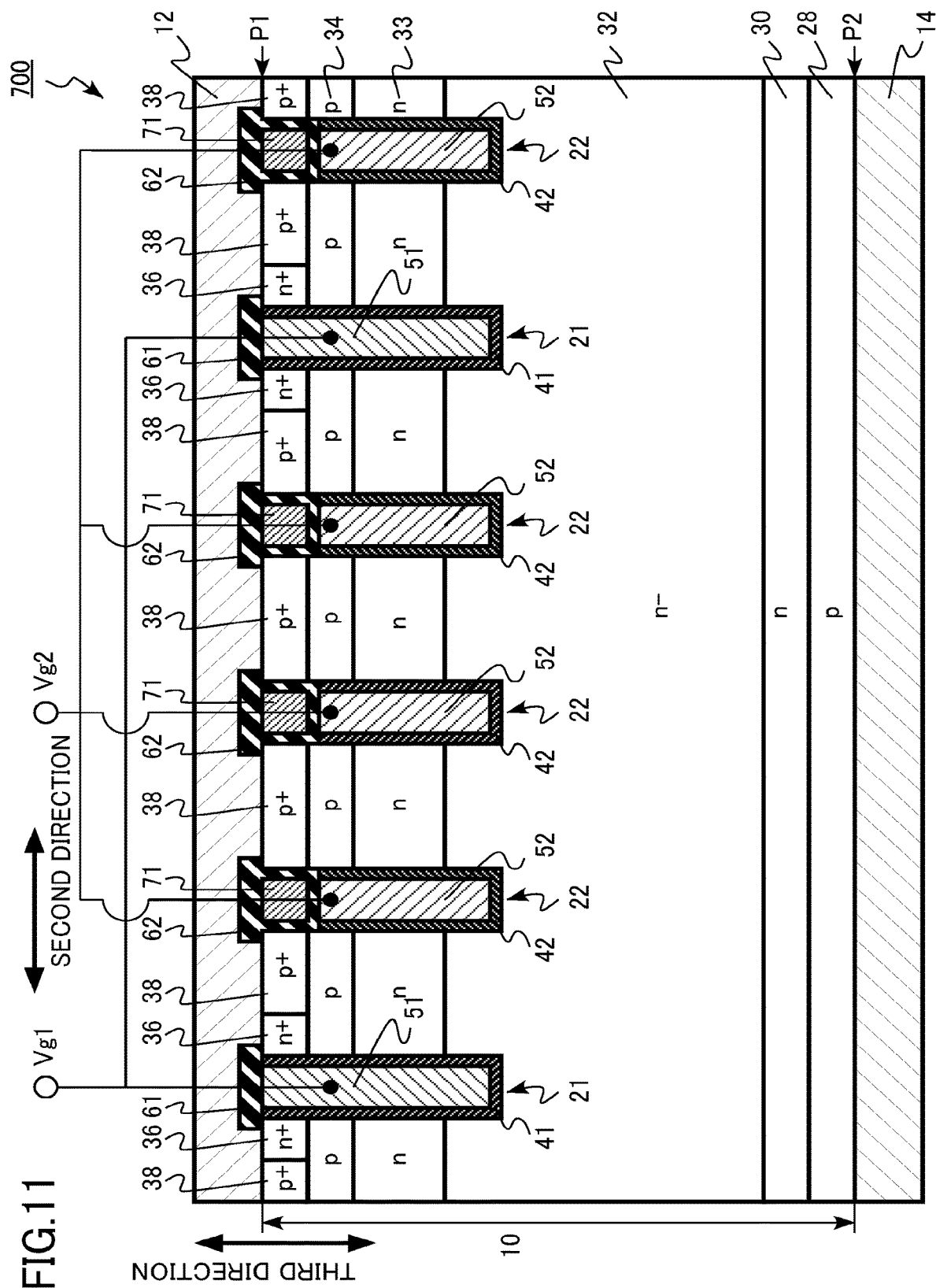
FIG. 11 is a schematic sectional view of part of a semiconductor device of a seventh embodiment.

FIG. 11 is a schematic sectional view of part of the semiconductor device of the seventh embodiment.

The semiconductor device of the seventh embodiment is an IGBT 700 of trench gate type including the gate electrodes in the trenches formed in the semiconductor layer.

The IGBT 700 includes an upper electrode 71 (first conductive layer) between the second gate electrode 52 and the emitter electrode 12. The upper electrode 71 is provided in the second gate trench 22.

The upper electrode 71 is separated from the second gate electrode 52. The upper electrode 71 is surrounded by, for example, the second insulating layer 62.

The upper electrode 71 is electrically isolated from the second gate electrode 52. The upper electrode 71 is electrically connected to the emitter electrode 12.

In the IGBT 700, the upper electrode 71 is provided, whereby an area is reduced of the semiconductor layer 10 facing the second gate electrode 52. For this reason, a gate capacitance of the second gate electrode 52 is reduced. Thus, the time can be shortened from the time t2 (see FIG. 4) at which the voltage applied to the second gate electrode pad 102 is changed from the first voltage (V1) to the second voltage (V2), to the time t3 (see FIG. 4) at which the turn-off voltage (Voff) is applied to the first gate electrode pad 101.

As described above, according to the IGBT of the seventh embodiment, as in the first embodiment, the first gate voltage (Vg1) applied to the first gate electrode 51 and the second gate voltage (Vg2) applied to the second gate electrode 52 are independently controlled, whereby the on-resistance can be reduced, and the switching loss can be reduced. Further, the time can be shortened from the time t2 (see FIG. 4) at which the voltage applied to the second gate electrode pad 102 is changed from the first voltage (V1) to the second voltage (V2), to the time t3 (see FIG. 4) at which the turn-off voltage (Voff) is applied to the first gate electrode pad 101.

Eighth Embodiment

A semiconductor device of an eighth embodiment is different from the first and seventh embodiments in that the semiconductor device of the eighth embodiment further includes a second conductive layer in the first trench, provided between the first gate electrode and the second plane, separated from the first gate electrode, and electrically connected to the first electrode. Hereinafter, description overlapping with the first embodiment and the seventh embodiment will be partially omitted.

Figure 12:
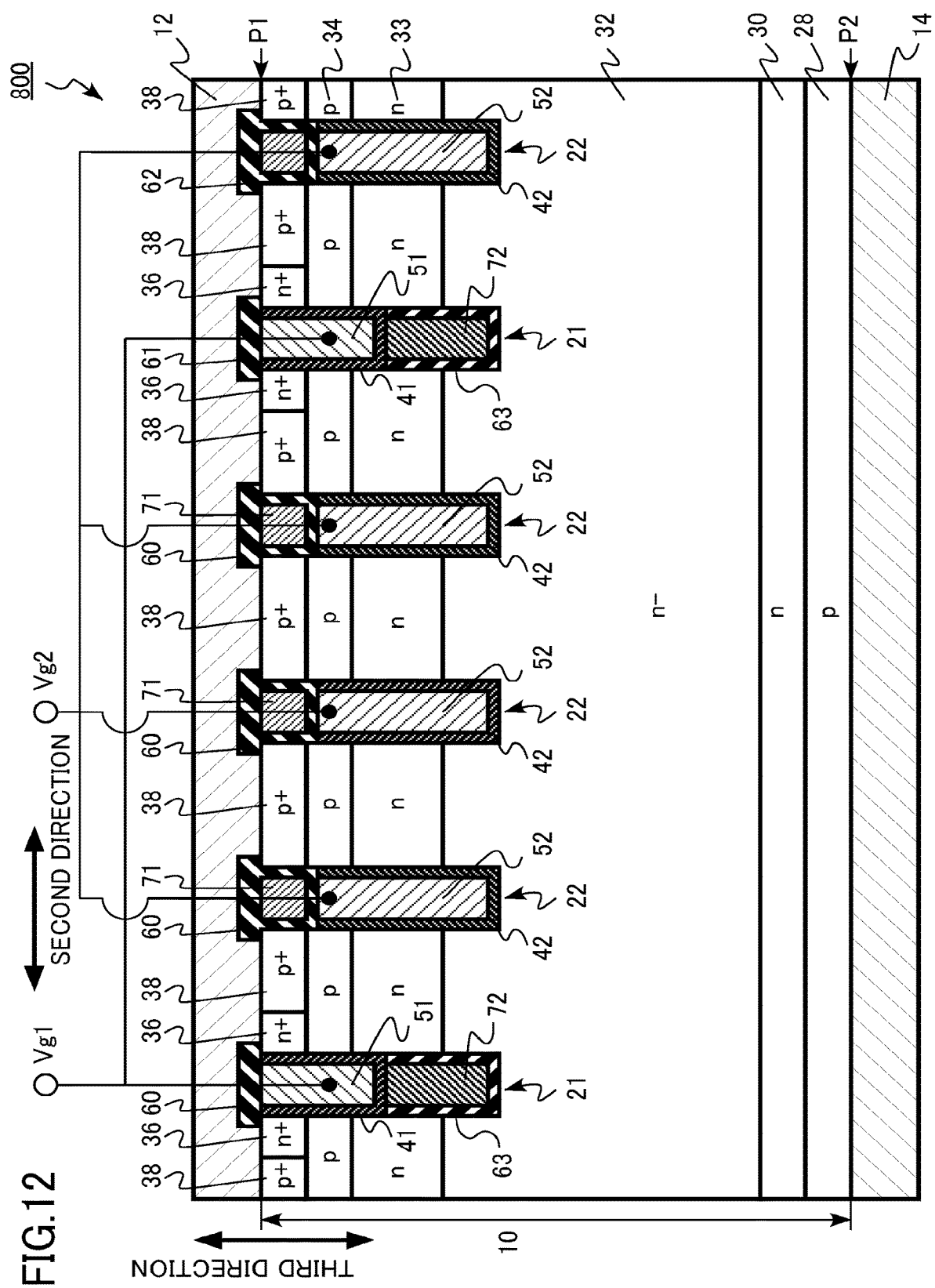
FIG. 12 is a schematic sectional view of part of a semiconductor device of an eighth embodiment.

FIG. 12 is a schematic sectional view of part of the semiconductor device of the eighth embodiment.

The semiconductor device of the eighth embodiment is an IGBT 800 of trench gate type including the gate electrodes in the trenches formed in the semiconductor layer.

The IGBT 800 has a lower conductive layer 72 (second conductive layer) between the first gate electrode 51 and the second plane P2. The lower conductive layer 72 is provided in the first gate trench 21. A third insulating layer 63 is provided between the lower conductive layer 72 and the semiconductor layer 10.

The lower conductive layer 72 is electrically isolated from the first gate electrode 51. The lower conductive layer 72 is electrically connected to the emitter electrode 12.

In the IGBT 800, the lower conductive layer 72 is provided, whereby an area is reduced of the semiconductor layer 10 facing the first gate electrode 51. For this reason, a gate capacitance of the first gate electrode 51 is reduced. Thus, the turn-on time and the turn-off time can be shortened. Therefore, the switching loss can be reduced.

As described above, according to the IGBT of the eighth embodiment, the on-resistance can be reduced, and the switching loss can be reduced.

Ninth Embodiment

A semiconductor device of an ninth embodiment is different from the first embodiment in that the second gate insulating film is in contact with the fifth semiconductor region. Hereinafter, description overlapping with the first embodiment will be partially omitted.

Figure 13:
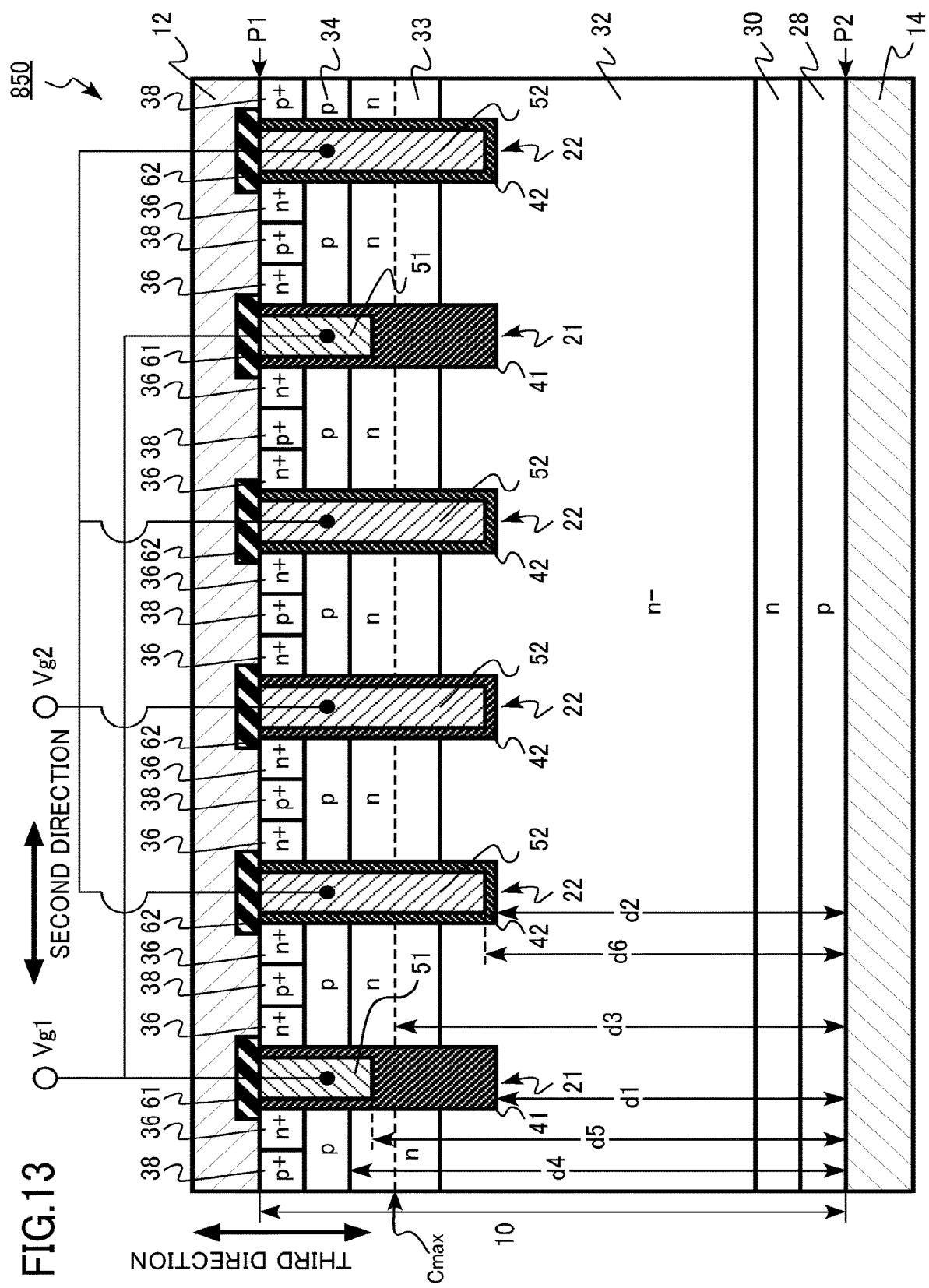
FIG. 13 is a schematic sectional view of part of a semiconductor device of an eighth embodiment.

FIG. 13 is a schematic sectional view of part of the semiconductor device of the ninth embodiment.

The semiconductor device of the ninth embodiment is an IGBT 850 of trench gate type including the gate electrodes in the trenches formed in the semiconductor layer.

The IGBT 850 has the second gate insulating film 42 in contact with the emitter region 36 (the fifth semiconductor region).

As described above, according to the IGBT of the ninth embodiment, the on-resistance can be reduced, and the switching loss can be reduced.

In the first to ninth embodiments, the case has been described as an example where the semiconductor layer is single crystal silicon; however, the semiconductor layer is not limited to single crystal silicon. For example, other single crystal semiconductors may be used, such as single crystal silicon carbide.

In the first to ninth embodiments, the case of the stripe shape has been described as an example, in which the trenches are disposed in parallel with each other; however, the present disclosure can be applied to mesh shape trenches in which the trenches intersect each other, or dot shape trenches.

In the first to ninth embodiments, the case has been described as an example where the first conductivity type is p-type and the second conductivity type is n-type; however, the first conductivity type can be n-type and the second conductivity type can be p-type. When the first conductivity type is n-type and the second conductivity type is p-type, for example, the second voltage (V2) is a positive voltage.

In the first to ninth embodiments, the case has been described as an example where the three second gate trenches 22 are sandwiched between the two first gate trenches 21; however, the disposition and ratio of the first gate trenches 21 and the second gate trenches 22 are not limited to the above-described embodiments.

In the first to ninth embodiments, the case has been described as an example where all the gate electrodes in the trenches other than the first gate trenches 21 are electrically connected to the second gate electrode pad 102. However, for example, a configuration can also be made in which the gate electrodes in some of the trenches other than the first gate trenches 21 are electrically connected to the emitter electrode 12.

While certain embodiments have been described, these embodiments have been presented by way of example only, and are not intended to limit the scope of the inventions. Indeed, the semiconductor device and the semiconductor circuit described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a semiconductor layer including a first plane and a second plane facing the first plane,
the semiconductor layer including
a first semiconductor region of first conductivity type,
a second semiconductor region of second conductivity type provided between the first semiconductor region and the first plane,
a third semiconductor region of second conductivity type provided between the second semiconductor region and the first plane and having a second conductivity type impurity concentration higher than a second conductivity type impurity concentration of the second semiconductor region,
a fourth semiconductor region of first conductivity type provided between the third semiconductor region and the first plane,
a fifth semiconductor region of second conductivity type provided between the fourth semiconductor region and the first plane,
a first trench provided on a side of the first plane, a first distance between the second plane and the first trench being smaller than a distance between the second plane and the fourth semiconductor region, and
a second trench provided on a side of the first plane, a second distance between the second plane and the second trench being smaller than the distance between the second plane and the fourth semiconductor region;
a first gate electrode provided in the first trench;
a first gate insulating film provided between the first gate electrode and the fourth semiconductor region, and between the first gate electrode and the fifth semiconductor region, and in contact with the fifth semiconductor region;
a second gate electrode provided in the second trench;
a second gate insulating film provided between the second gate electrode and the third semiconductor region, and between the second gate electrode and the fourth semiconductor region;
a first electrode provided on a first plane side of the semiconductor layer and electrically connected to the fifth semiconductor region;
a second electrode provided on a second plane side of the semiconductor layer and electrically connected to the first semiconductor region;
a first gate electrode pad provided on the first plane side of the semiconductor layer and electrically connected to the first gate electrode, the first gate electrode pad electrically separated from the first electrode, a first gate voltage being applied to the first gate electrode pad; and
a second gate electrode pad provided on the first plane side of the semiconductor layer and electrically connected to the second gate electrode, the second gate electrode pad electrically separated from the first electrode, second gate voltage being applied to the second gate electrode pad, wherein
a thickness of the first gate insulating film between the second plane and the first gate electrode is thicker than a thickness of the second gate insulating film between the second plane and the second gate electrode,
a thickness of the first gate insulating film between the first gate electrode and the third semiconductor region is thicker than a thickness of the second gate insulating film between the second gate electrode and the third semiconductor region, and
the thickness of the first gate insulating film between the first gate electrode and the third semiconductor region is thicker than a thickness of the first gate insulating film between the first gate electrode and the fifth semiconductor region.

2. A semiconductor circuit comprising:
the semiconductor device according to claim 1; and
a control circuit configured to drive the semiconductor device, the control circuit configured to control voltages applied to the first gate electrode pad and the second gate electrode pad.

3. A semiconductor device comprising:
a semiconductor layer including a first plane and a second plane facing the first plane,
the semiconductor layer including
a first semiconductor region of first conductivity type,
a second semiconductor region of second conductivity type provided between the first semiconductor region and the first plane, a third semiconductor region of second conductivity type provided between the second semiconductor region and the first plane and having a second conductivity type impurity concentration higher than a second conductivity type impurity concentration of the second semiconductor region,
a fourth semiconductor region of first conductivity type provided between the third semiconductor region and the first plane,
a fifth semiconductor region of second conductivity type provided between the fourth semiconductor region and the first plane,
a first trench provided on a side of the first plane, a first distance between the second plane and the first trench being smaller than a distance between the second plane and the fourth semiconductor region, and
a second trench provided on a side of the first plane, a second distance between the second plane and the second trench being smaller than the distance between the second plane and the fourth semiconductor region;
a first gate electrode provided in the first trench;
a first gate insulating film provided between the first gate electrode and the fourth semiconductor region, and between the first gate electrode and the fifth semiconductor region, and in contact with the fifth semiconductor region;
a second gate electrode provided in the second trench;
a second gate insulating film provided between the second gate electrode and the third semiconductor region, and between the second gate electrode and the fourth semiconductor region;
a first electrode provided on a first plane side of the semiconductor layer and electrically connected to the fifth semiconductor region;
a second electrode provided on a second plane side of the semiconductor layer and electrically connected to the first semiconductor region;
a first gate electrode pad provided on the first plane side of the semiconductor layer and electrically connected to the first gate electrode, the first gate electrode pad electrically separated from the first electrode, a first gate voltage being applied to the first gate electrode pad; and
a second gate electrode pad provided on the first plane side of the semiconductor layer and electrically connected to the second gate electrode, the second gate electrode pad electrically separated from the first electrode, second gate voltage being applied to the second gate electrode pad, wherein
a thickness of the first gate insulating film between the second plane and the first gate electrode is thicker than a thickness of the second gate insulating film between the second plane and the second gate electrode, and
the semiconductor layer includes: a third trench provided on the side of the first plane, the second trench interposed between the third trench and the first trench, a third distance between the second plane and the third trench being smaller than the distance between the second plane and the fourth semiconductor region; and
a third gate electrode provided in the third trench and electrically connected to the second gate electrode pad, and
the third semiconductor region interposed between the second trench and the third trench is in contact with the first plane.

4. A semiconductor device comprising:
a semiconductor layer including a first plane and a second plane facing the first plane,
the semiconductor layer including
a first semiconductor region of first conductivity type,
a second semiconductor region of second conductivity type provided between the first semiconductor region and the first plane,
a third semiconductor region of second conductivity type provided between the second semiconductor region and the first plane and having a second conductivity type impurity concentration higher than a second conductivity type impurity concentration of the second semiconductor region,
a fourth semiconductor region of first conductivity type provided between the third semiconductor region and the first plane,
a fifth semiconductor region of second conductivity type provided between the fourth semiconductor region and the first plane,
a first trench provided on a side of the first plane, a first distance between the second plane and the first trench being smaller than a distance between the second plane and the fourth semiconductor region, and
a second trench provided on a side of the first plane, a second distance between the second plane and the second trench being smaller than the distance between the second plane and the fourth semiconductor region;
a first gate electrode provided in the first trench;
a first gate insulating film provided between the first gate electrode and the fourth semiconductor region, and between the first gate electrode and the fifth semiconductor region, and in contact with the fifth semiconductor region;
a second gate electrode provided in the second trench;
a second gate insulating film provided between the second gate electrode and the third semiconductor region, and between the second gate electrode and the fourth semiconductor region;
a first electrode provided on a first plane side of the semiconductor layer and electrically connected to the fifth semiconductor region;
a second electrode provided on a second plane side of the semiconductor layer and electrically connected to the first semiconductor region;
a first gate electrode pad provided on the first plane side of the semiconductor layer and electrically connected to the first gate electrode, the first gate electrode pad electrically separated from the first electrode, a first gate voltage being applied to the first gate electrode pad; and
a second gate electrode pad provided on the first plane side of the semiconductor layer and electrically connected to the second gate electrode, the second gate electrode pad electrically separated from the first electrode, second gate voltage being applied to the second gate electrode pad, wherein
the first distance is larger than the second distance, and
the first distance is larger than a distance between the second plane and a maximum concentration position of second conductivity type impurities in the third semiconductor region.

5. A semiconductor device comprising:
a semiconductor layer including a first plane and a second plane facing the first plane, the semiconductor layer including
  a first semiconductor region of first conductivity type,
  a second semiconductor region of second conductivity type provided between the first semiconductor region and the first plane,
  a third semiconductor region of second conductivity type provided between the second semiconductor region and the first plane and having a second conductivity type impurity concentration higher than a second conductivity type impurity concentration of the second semiconductor region,
  a fourth semiconductor region of first conductivity type provided between the third semiconductor region and the first plane,
  a fifth semiconductor region of second conductivity type provided between the fourth semiconductor region and the first plane,
  a first trench provided on a side of the first plane, a first distance between the second plane and the first trench being smaller than a distance between the second plane and the fourth semiconductor region, and
  a second trench provided on a side of the first plane, a second distance between the second plane and the second trench being smaller than the distance between the second plane and the fourth semiconductor region;
a first gate electrode provided in the first trench;
a first gate insulating film provided between the first gate electrode and the fourth semiconductor region, and between the first gate electrode and the fifth semiconductor region, and in contact with the fifth semiconductor region;
a second gate electrode provided in the second trench;
a second gate insulating film provided between the second gate electrode and the third semiconductor region, and between the second gate electrode and the fourth semiconductor region;
a first electrode provided on a first plane side of the semiconductor layer and electrically connected to the fifth semiconductor region;
a second electrode provided on a second plane side of the semiconductor layer and electrically connected to the first semiconductor region;
a first gate electrode pad provided on the first plane side of the semiconductor layer and electrically connected to the first gate electrode, the first gate electrode pad electrically separated from the first electrode, a first gate voltage being applied to the first gate electrode pad; and
a second gate electrode pad provided on the first plane side of the semiconductor layer and electrically connected to the second gate electrode, the second gate electrode pad electrically separated from the first electrode, second gate voltage being applied to the second gate electrode pad, wherein
the first distance is larger than the second distance, and
the fourth semiconductor region interposed between the first trench and the second trench is in contact with the second semiconductor region.

6. A semiconductor device comprising:
a semiconductor layer including a first plane and a second plane facing the first plane,
the semiconductor layer including
  a first semiconductor region of first conductivity type,
  a second semiconductor region of second conductivity type provided between the first semiconductor region and the first plane,
  a third semiconductor region of second conductivity type provided between the second semiconductor region and the first plane and having a second conductivity type impurity concentration higher than a second conductivity type impurity concentration of the second semiconductor region,
  a fourth semiconductor region of first conductivity type provided between the third semiconductor region and the first plane,
  a fifth semiconductor region of second conductivity type provided between the fourth semiconductor region and the first plane,
  a first trench provided on a side of the first plane, a first distance between the second plane and the first trench being smaller than a distance between the second plane and the fourth semiconductor region, and
  a second trench provided on a side of the first plane, a second distance between the second plane and the second trench being smaller than the distance between the second plane and the fourth semiconductor region;
a first gate electrode provided in the first trench;
a first gate insulating film provided between the first gate electrode and the fourth semiconductor region, and between the first gate electrode and the fifth semiconductor region, and in contact with the fifth semiconductor region;
a second gate electrode provided in the second trench;
a second gate insulating film provided between the second gate electrode and the third semiconductor region, and between the second gate electrode and the fourth semiconductor region;
a first electrode provided on a first plane side of the semiconductor layer and electrically connected to the fifth semiconductor region;
a second electrode provided on a second plane side of the semiconductor layer and electrically connected to the first semiconductor region;
a first gate electrode pad provided on the first plane side of the semiconductor layer and electrically connected to the first gate electrode, the first gate electrode pad electrically separated from the first electrode, a first gate voltage being applied to the first gate electrode pad;
a second gate electrode pad provided on the first plane side of the semiconductor layer and electrically connected to the second gate electrode, the second gate electrode pad electrically separated from the first electrode, second gate voltage being applied to the second gate electrode pad;
a first insulating layer provided between the first gate electrode and the first electrode; and
a second insulating layer provided between the second gate electrode and the first electrode, wherein
a distance between the second gate electrode and the first electrode is larger than a distance between the first gate electrode and the first electrode, and
a thickness in a normal direction of the first plane of the second insulating layer is thicker than a thickness in the normal direction of the first plane of the first insulating layer.

7. The semiconductor device according to claim 6, wherein a distance between the second plane and the second insulating layer is smaller than a distance between the second plane and the fifth semiconductor region.

8. A semiconductor device comprising:
a semiconductor layer including a first plane and a second plane facing the first plane,
the semiconductor layer including
a first semiconductor region of first conductivity type,
a second semiconductor region of second conductivity type provided between the first semiconductor region and the first plane,
a third semiconductor region of second conductivity type provided between the second semiconductor region and the first plane and having a second conductivity type impurity concentration higher than a second conductivity type impurity concentration of the second semiconductor region,
a fourth semiconductor region of first conductivity type provided between the third semiconductor region and the first plane,
a fifth semiconductor region of second conductivity type provided between the fourth semiconductor region and the first plane,
a first trench provided on a side of the first plane, a first distance between the second plane and the first trench being smaller than a distance between the second plane and the fourth semiconductor region, and
a second trench provided on a side of the first plane, a second distance between the second plane and the second trench being smaller than the distance between the second plane and the fourth semiconductor region;
a first gate electrode provided in the first trench;
a first gate insulating film provided between the first gate electrode and the fourth semiconductor region, and between the first gate electrode and the fifth semiconductor region, and in contact with the fifth semiconductor region;
a second gate electrode provided in the second trench;
a second gate insulating film provided between the second gate electrode and the third semiconductor region, and between the second gate electrode and the fourth semiconductor region;
a first electrode provided on a first plane side of the semiconductor layer and electrically connected to the fifth semiconductor region;
a second electrode provided on a second plane side of the semiconductor layer and electrically connected to the first semiconductor region;
a first gate electrode pad provided on the first plane side of the semiconductor layer and electrically connected to the first gate electrode, the first gate electrode pad electrically separated from the first electrode, a first gate voltage being applied to the first gate electrode pad; and
a second gate electrode pad provided on the first plane side of the semiconductor layer and electrically connected to the second gate electrode, the second gate electrode pad electrically separated from the first electrode, second gate voltage being applied to the second gate electrode pad, wherein
a thickness of the second gate insulating film between the second gate electrode and the fourth semiconductor region is thicker than a thickness of the first gate insulating film between the first gate electrode and the fourth semiconductor region, and the thickness of the second gate insulating film between the second gate electrode and the fourth semiconductor region is thicker than a thickness of the second gate insulating film between the second gate electrode and the third semiconductor region.

9. The semiconductor device according to claim 8, wherein the thickness of the second gate insulating film between the second gate electrode and the fourth semiconductor region is greater than or equal to three times the thickness of the second gate insulating film between the second gate electrode and the third semiconductor region.

10. A semiconductor device comprising:
a semiconductor layer including a first plane and a second plane facing the first plane,
the semiconductor layer including
a first semiconductor region of first conductivity type,
a second semiconductor region of second conductivity type provided between the first semiconductor region and the first plane,
a third semiconductor region of second conductivity type provided between the second semiconductor region and the first plane and having a second conductivity type impurity concentration higher than a second conductivity type impurity concentration of the second semiconductor region,
a fourth semiconductor region of first conductivity type provided between the third semiconductor region and the first plane,
a fifth semiconductor region of second conductivity type provided between the fourth semiconductor region and the first plane,
a first trench provided on a side of the first plane, a first distance between the second plane and the first trench being smaller than a distance between the second plane and the fourth semiconductor region, and
a second trench provided on a side of the first plane, a second distance between the second plane and the second trench being smaller than the distance between the second plane and the fourth semiconductor region;
a first gate electrode provided in the first trench;
a first gate insulating film provided between the first gate electrode and the fourth semiconductor region, and between the first gate electrode and the fifth semiconductor region, and in contact with the fifth semiconductor region;
a second gate electrode provided in the second trench;
a second gate insulating film provided between the second gate electrode and the third semiconductor region, and between the second gate electrode and the fourth semiconductor region;
a first electrode provided on a first plane side of the semiconductor layer and electrically connected to the fifth semiconductor region;
a second electrode provided on a second plane side of the semiconductor layer and electrically connected to the first semiconductor region;
a first gate electrode pad provided on the first plane side of the semiconductor layer and electrically connected to the first gate electrode, the first gate electrode pad electrically separated from the first electrode, a first gate voltage being applied to the first gate electrode pad;
a second gate electrode pad provided on the first plane side of the semiconductor layer and electrically connected to the second gate electrode, the second gate electrode pad electrically separated from the first electrode, second gate voltage being applied to the second gate electrode pad; and a first conductive layer in the second trench, provided between the second gate electrode and the first electrode, separated from the second gate electrode, and electrically connected to the first electrode.

11. The semiconductor device according to claim 10, further comprising a second conductive layer in the first trench, provided between the first gate electrode and the second plane, separated from the first gate electrode, and electrically connected to the first electrode.

* * * * *